(12) United States Patent
Ohta et al.

(10) Patent No.: US 7,821,607 B2
(45) Date of Patent: Oct. 26, 2010

(54) LIQUID CRYSTAL DISPLAY DEVICE

(75) Inventors: Masuyuki Ohta, Mobara (JP);
Masahiro Ishi, Mobara (JP); Kikuo Ono, Mobara (JP); Nobuyuki Suzuki, Mobara (JP)

(73) Assignee: Hitachi, Ltd., Tokyo (JP)

( * ) Notice: Subject to any disclaimer, the term of this patent is extended or adjusted under 35 U.S.C. 154(b) by 276 days.

(21) Appl. No.: 12/055,032

(22) Filed: Mar. 25, 2008

(65) Prior Publication Data

US 2008/0174729 A1      Jul. 24, 2008

Related U.S. Application Data

(63) Continuation of application No. 11/186,906, filed on Jul. 22, 2005, now abandoned, which is a continuation of application No. 10/838,241, filed on May 5, 2004, now Pat. No. 6,924,865, which is a continuation of application No. 10/366,410, filed on Feb. 14, 2003, now Pat. No. 6,738,108.

(51) Int. Cl.
*G02F 1/1343* (2006.01)

(52) U.S. Cl. ...................................... 349/141

(58) Field of Classification Search ............ None
See application file for complete search history.

(56) References Cited

U.S. PATENT DOCUMENTS

| | | | |
|---|---|---|---|
| 5,434,686 A | 7/1995 | Kanemori et al. | |
| 5,598,285 A | 1/1997 | Kondo et al. | |
| 5,754,266 A | 5/1998 | Ohta et al. | |
| 5,786,876 A | 7/1998 | Ota et al. | |
| 5,831,707 A | 11/1998 | Ota et al. | |
| 5,852,481 A | 12/1998 | Whang | |
| 5,907,379 A | 5/1999 | Kim et al. | |
| 5,910,271 A | 6/1999 | Ohe et al. | |
| 5,914,762 A | 6/1999 | Lee et al. | |
| 5,933,208 A * | 8/1999 | Kim | 349/106 |
| 5,977,562 A * | 11/1999 | Hirakata et al. | 257/72 |
| 5,990,987 A | 11/1999 | Tanaka | |
| 6,014,190 A * | 1/2000 | Kim et al. | 349/39 |
| 6,016,174 A | 1/2000 | Endo et al. | |
| 6,049,369 A | 4/2000 | Yanagawa et al. | |
| 6,054,392 A | 4/2000 | Ura et al. | |
| 6,087,678 A | 7/2000 | Kim | |
| 6,111,625 A | 8/2000 | Ohta et al. | |
| 6,133,977 A | 10/2000 | Lee | |
| 6,175,393 B1 | 1/2001 | Ban et al. | |
| 6,188,458 B1 | 2/2001 | Tagusa et al. | |

(Continued)

FOREIGN PATENT DOCUMENTS

JP          4-318522          11/1992

(Continued)

*Primary Examiner*—Timothy Rude
(74) *Attorney, Agent, or Firm*—Antonelli, Terry, Stout & Kraus, LLP.

(57) ABSTRACT

A liquid crystal display device is provided which includes first and second substrates with liquid crystal therebetween. Gate lines and drain lines are formed on the first substrate with pixel regions defined by the gate signal lines and drain signal lines. Each pixel region includes a pixel electrode and a counter electrode formed in different layers from one another, with the counter layer being formed in a layer closer to the liquid crystal layer than the pixel electrode.

9 Claims, 25 Drawing Sheets

U.S. PATENT DOCUMENTS

| | | |
|---|---|---|
| 6,191,832 B1 | 2/2001 | Nakakura |
| 6,215,541 B1 | 4/2001 | Song |
| 6,256,076 B1 | 7/2001 | Bae et al. |
| 6,266,117 B1 | 7/2001 | Yanagawa |
| 6,433,764 B1 | 8/2002 | Hebiguchi et al. |
| 6,771,342 B1 * | 8/2004 | Hirakata et al. ............. 349/141 |

FOREIGN PATENT DOCUMENTS

| | | |
|---|---|---|
| JP | 6-202127 | 7/1994 |
| JP | 7-36058 | 2/1995 |
| JP | 9-15650 | 1/1997 |
| JP | 9-73101 | 3/1997 |
| JP | 9-80473 | 3/1997 |
| JP | 09-090410 | 3/1997 |
| JP | 09-073101 | 4/1997 |
| JP | 9-90410 | 4/1997 |
| JP | 9-230387 | 9/1997 |
| WO | WO97/10530 | 3/1997 |

* cited by examiner

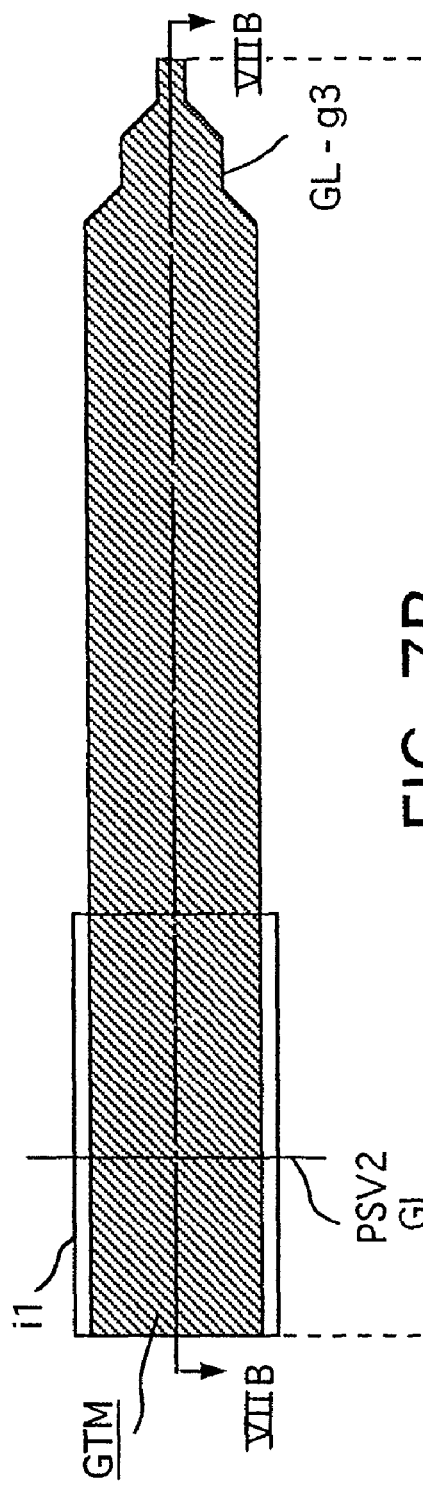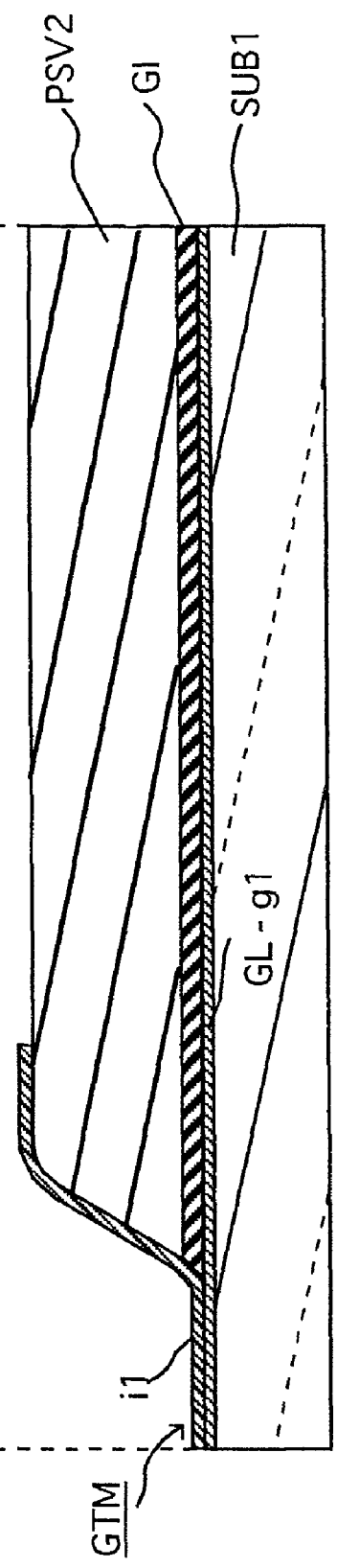

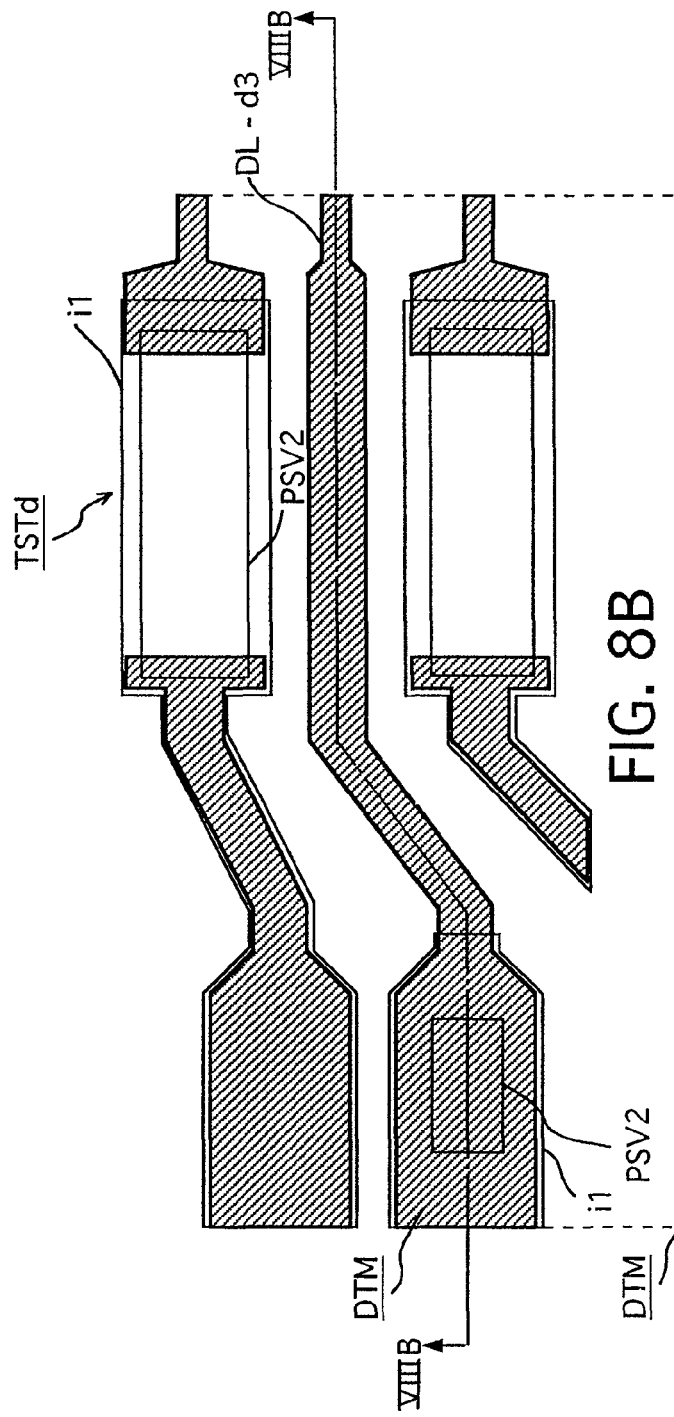
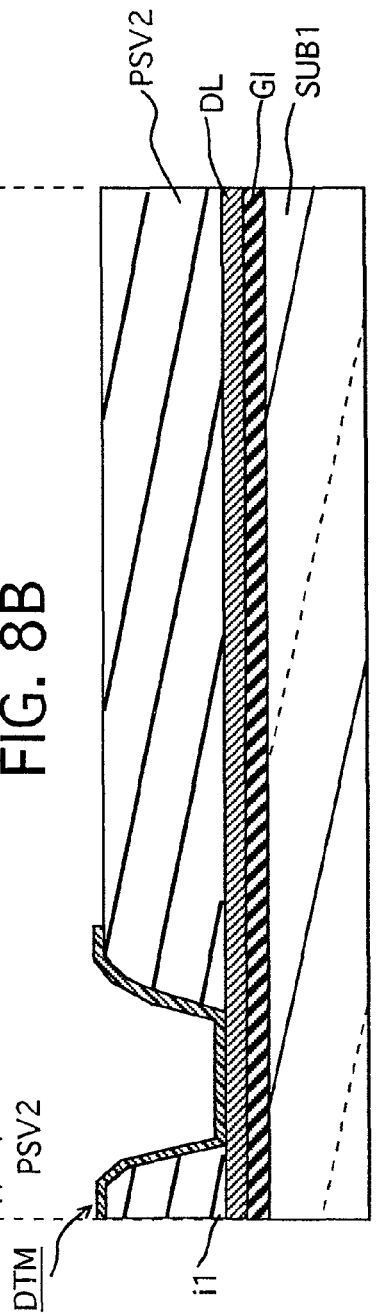

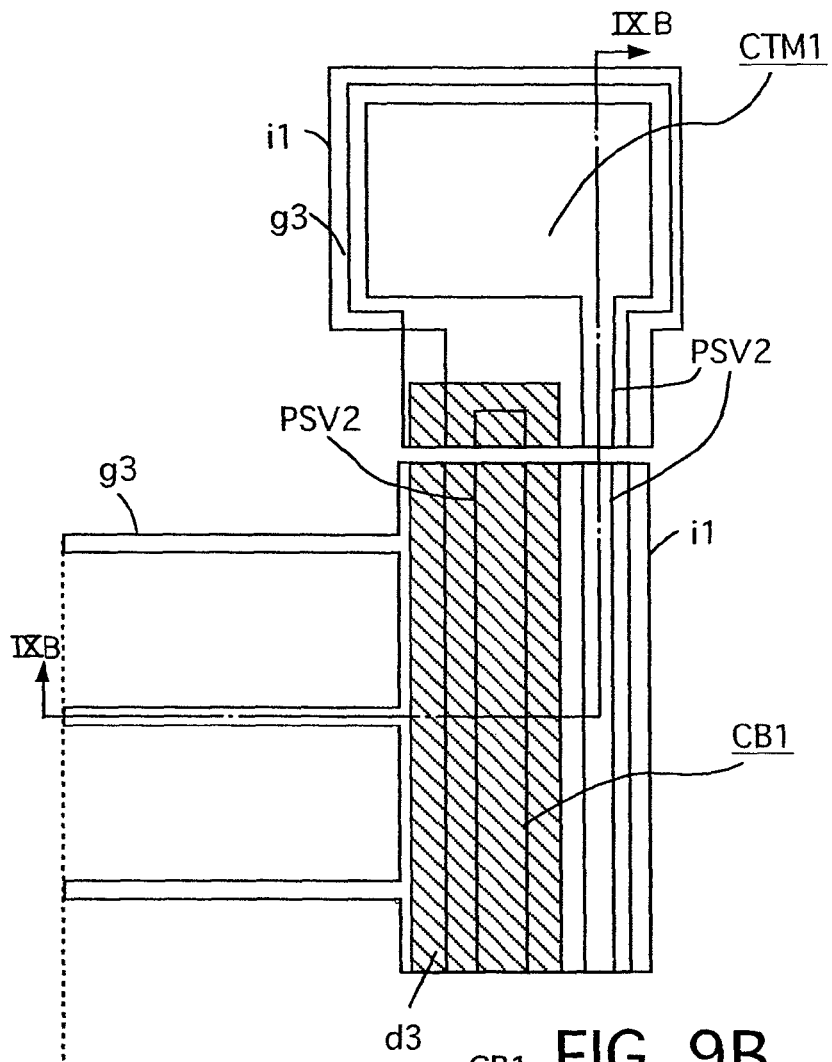
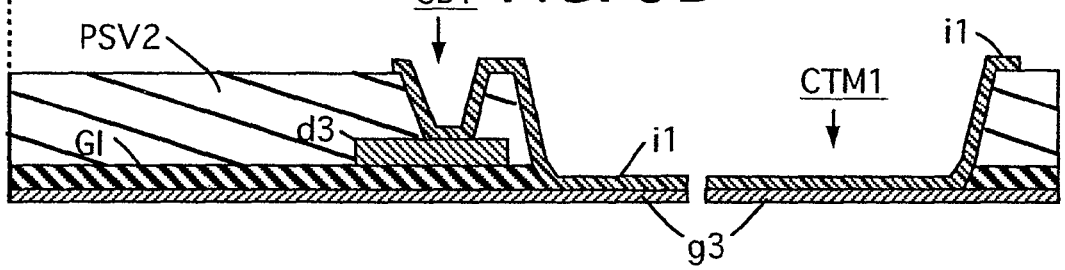

LIQUID CRYSTAL DISPLAY DEVICE

CROSS REFERENCE TO RELATED APPLICATION

This application is a continuation of U.S. application Ser. No. 11/186,906, filed Jul. 22, 2005, now abandoned which, is a continuation of U.S. application Ser. No. 10/838,241, filed May 5, 2004 (now U.S. Pat. No. 6,924,865), which is a continuation of U.S. application Ser. No. 10/366,410, filed Feb. 14, 2003 (now U.S. Pat. No. 6,738,108), which was with U.S. application Ser. No. 10/366,409, filed Feb. 14, 2003 (now U.S. Pat. No. 6,693,687), which are continuations of U.S. application Ser. No. 10/115,939, filed Apr. 5, 2002, (now U.S. Pat. No. 6,522,369), which was with U.S. application Ser. No. 10/115,916, filed Apr. 5, 2002, (now U.S. Pat. No. 6,512,567), which are continuations of U.S. application Ser. No. 09/793,921, filed Feb. 28, 2001, (now U.S. Pat. No. 6,388,725), and is with U.S. application Ser. No. 09/793,903, filed Feb. 28, 2001, (now U.S. Pat. No. 6,392,730), which are continuations of U.S. application Ser. No. 09/402,645, filed Oct. 8, 1999, (now U.S. Pat. No. 6,208,399), which is a 371 of PCT/JP98/01500, filed Apr. 1, 1998, the subject matter of which is incorporated by reference herein.

FIELD OF THE INVENTION

This invention relates to a liquid crystal display device; and, more particularly, the invention relates to a high picture quality image active matrix system liquid crystal display device having thin film transistor elements.

BACKGROUND OF THE INVENTION

A so-called transverse electric field system color liquid crystal display device is constructed such that transparent substrates are disposed in an opposed manner with a liquid crystal layer interposed therebetween, electrodes for display and reference electrodes are provided on liquid-crystal-side surfaces of regions of one or both of the transparent substrates which correspond to respective unit pixels, and electric fields are generated between these display electrodes and the reference electrodes parallel to the surfaces of the transparent substrates so as to modulate light which is transmitted through the liquid crystal layer. Such a color liquid crystal display device has been known to have a so-called excellent broad visual field angle which allows a person to recognize a clear image even from a position which is at a large angle relative to the display screen.

Liquid crystal display devices having such a construction are described in detail in, for example, Japanese publication of the translation of international patent application Hei 5-505247, Japanese patent publication Sho 63-21907 and Japanese laid-open patent publication Hei 6-160878.

However, a liquid crystal display element having the above-mentioned construction still has a problem in that an unnecessary electric field generated by the drain lines causes fluctuation of an electric field between the display electrodes and the reference electrodes, and so a bad image quality in which stripes are produced in a direction along the drain lines, or a so-called longitudinal smear (crosstalk), occurs. Means for solving this problem has been described in Japanese laid-open patent publication Hei 6-202127. The liquid crystal display element having the disclosed construction, however, is provided with shield electrodes and an electric potential is supplied from the outside; and, hence, it still has problems in that the charging or discharging of an electric current to a capacitance between the shield electrodes and the signal electrodes is large, the load on the drive circuit is large thus making the power consumption large and the drive circuit large, and a connecting means for applying the electric potential to the shield electrodes becomes necessary, thus increasing the steps and giving rise to connection failures.

The present invention has been made in view of the foregoing problems, and it is an object of the present invention to provide a liquid crystal display device which can suppress the occurrence of longitudinal smear and enhance the productivity, while also enabling a low power consumption.

SUMMARY OF THE INVENTION

To achieve the above object, the present invention is constituted by an active matrix system liquid crystal display device which includes a plurality of pixels which are composed of a plurality of drain lines and a plurality of scanning electrodes, and includes pixel electrodes and counter electrodes which are capable of applying an electric field parallel to substrate surfaces in the pixels, and image signals are capable of being supplied to the pixel electrodes from thin film transistors connected to the drain lines and gate lines, wherein the counter electrodes and the pixel electrodes are formed linearly so as not to overlap each other in a planar condition, and an insulating film having a specific dielectric constant not greater than 4 is formed on the drain line, and the counter electrodes are formed on the insulating film such that they cover the drain lines.

The invention is further constituted by an active matrix system liquid crystal display device, as described above, in which the pixel electrodes are formed on the insulating film.

The is further constituted by an active matrix system liquid crystal display device, as described above, in which the insulating film and at least either one of a gate insulating film and a passivation layer of the thin film transistor element are formed in the same pattern.

The invention is further constituted by an active matrix system liquid crystal display device, as described above, having light shielding films extending horizontally in stripes.

The invention is constituted by an active matrix system liquid crystal display device, as described above, which has an insulating film having a film thickness of not smaller than 1 μm and not greater than 3 μm.

The invention is constituted by an active matrix system liquid crystal display device, as described above, which an the insulating film made of a resist material.

The invention is constituted by an active matrix system liquid crystal display device, as described above, in which an inorganic insulating film which protects the thin film transistor element has a film thickness of not smaller than 0.05 μm and not greater than 0.3 μm.

The liquid crystal display element having the above-mentioned construction is produced from the following three operations.

<Operation 1>

Reference electrodes are formed on an organic insulating film in such a manner that the reference electrodes are completely overlapped on drain lines formed on one transparent substrate side in a plan view; and, hence, almost all of the unnecessary lines of electric force which are generated by the drain lines are terminated at the reference electrodes. Accordingly, the crosstalk due to the leakage electric field which is peculiar to a display system, such as the display system of the present invention which adopts a transverse electric field, can be resolved. In this manner, the leakage electric field is more completely shielded than it would be by the shield electrodes which have been conventionally disposed at both sides of the drain line or on the counter substrate; and, hence, the horizontal direction of the pixels can be occupied by the display electrodes, reference electrodes and opening portions. Furthermore, it is also unnecessary to hide the gap between the drain line and the reference electrode, and, hence, a light insulating film (black matrix) in a vertical direction can be eliminated. Therefore, a low aperture efficiency, which is the largest defect in the display system adopting a transverse electric field, can be drastically improved and an aperture efficiency exceeding 50% can be realized. Namely, according to the present invention, a high aperture efficiency and a low smear condition are compatible.

(Operation 2)

The specific dielectric constant of the organic insulating film is approximately half (the specific dielectric constant $\in r$ being approximately 3) that of the inorganic insulating film. Furthermore, since the thickness of the organic passivation layer can be easily increased compared to the inorganic passivation layer, the distance between the drain line and the reference electrode is expanded. Even when these drain lines are entirely covered with the reference electrodes, the capacity formed between the drain lines and the reference electrodes can be made considerably small. Accordingly, the load as seen from the drain lines is reduced, so that the wiring propagation delay of the image signal becomes small, and the signal voltage is sufficiently charged into the display electrodes and the drive circuit for driving the drain lines can be minimized.

<Operation 3>

The organic passivation layer has an excellent flatness so that when the organic passivation layer is coated on the uppermost layer of the substrate which constitutes an active element, the flatness of the substrate which constitutes the active element is enhanced. Accordingly, the irregularities of the brightness (transmission factor)-voltage characteristics caused by the irregularities of the gap between the substrates can be eliminated thus enhancing the uniformity of the brightness.

BRIEF EXPLANATION OF THE DRAWINGS

FIGS. 7A and 7B are plan and cross sectional views, respectively, showing the vicinity of a connecting portion between a gate terminal GTM and a gate line GL.

FIGS. 8A and 8B are plan and cross sectional views, respectively, showing the vicinity of a connecting portion between a drain terminal DTM and a drain line DL.

FIGS. 9A and 9B are plan and cross sectional views, respectively, showing the vicinity of a connecting portion between a common electrode terminal CTM1, a common bus line CB1 and a common voltage signal line CL.

BEST MODE FOR CARRYING OUT THE INVENTION

Figure 1:
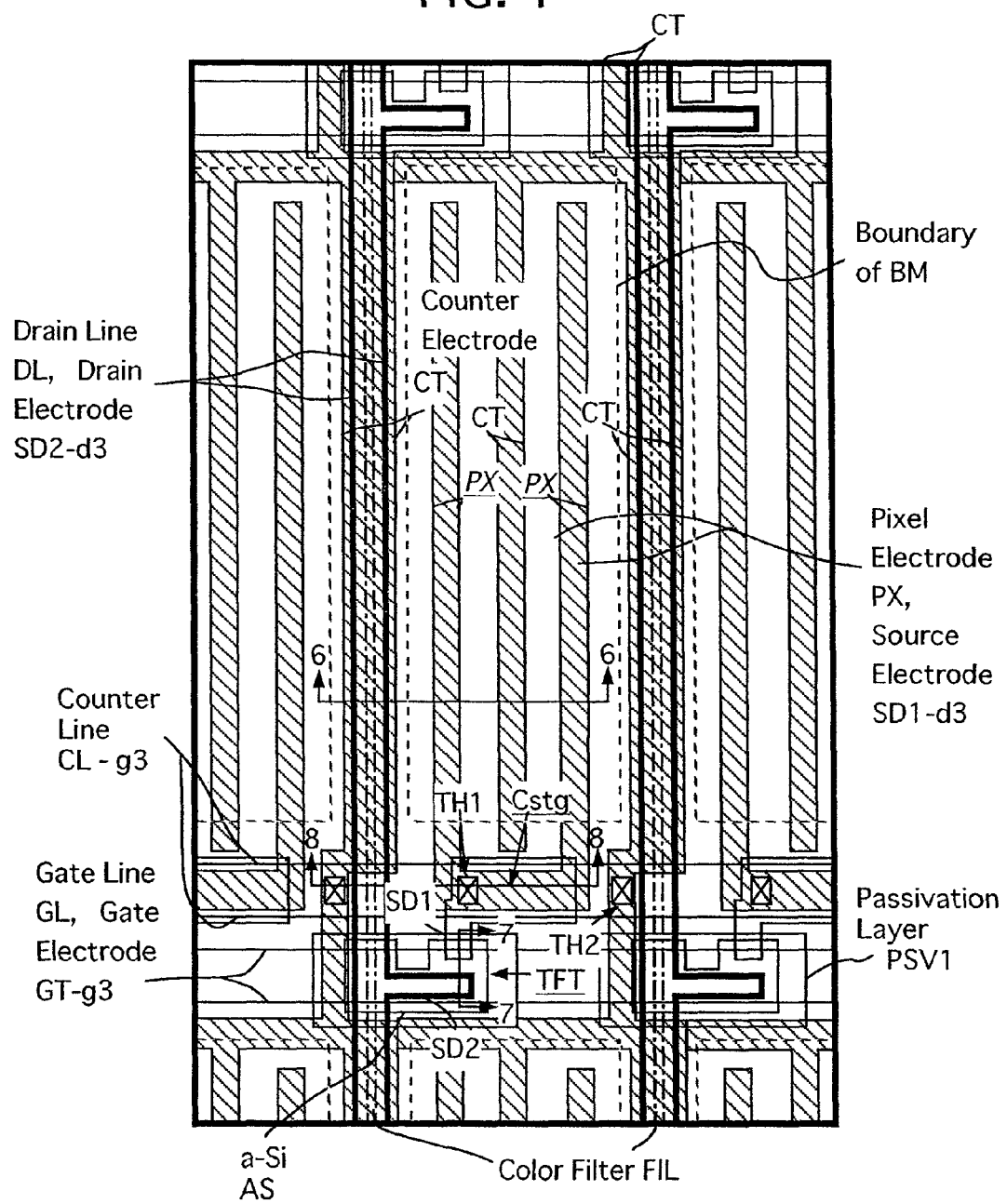
FIG. 1 is a plan view of an essential part showing one pixel and a peripheral portion of a liquid crystal display portion of an active matrix system color liquid crystal display device representing an embodiment of the present invention.

The present invention, other objects of the present invention and other features of the present invention will be clearly understood from the following explanation and the accompanying drawings.

Embodiment 1

<<Active Matrix Liquid Crystal Display Devices>>

Hereinafter, an embodiment where the present invention is applied to an active matrix system color liquid crystal display device will be explained. In the drawings, elements which have the same function are indicated by the same symbols and a repeated explanation thereof is omitted.

<<Planar Construction of the Matrix Portion (Pixel Portion)>>

FIG. 1 is a plan view showing one pixel and its periphery of the active matrix system color liquid crystal display device of the present invention.

As shown in FIG. 1, each pixel is disposed in an intersect region (region enclosed by four signal lines) defined by a gate line (scanning signal line or a horizontal signal line) GL, a counter line (counter voltage signal line) CL, and two neighboring drain lines (image signal lines or vertical signal lines) DL. Each pixel includes a thin film transistor TFT, a storage capacitance Cstg, a pixel electrode PX (called a pixel electrode in this embodiment and acts as a display electrode) and a counter electrode CT (called a counter electrode in this embodiment and means a reference electrode). The gate lines GL and the counter lines CL extend in a left to right direction in the drawing and are distributed in plural numbers in an upward to downward direction. The counter lines CL may be considered as reference lines in each pixel. The drain lines DL extend in an upward to downward direction in the drawing and are disposed in plural numbers in a left to right direction. The pixel electrodes PX are electrically connected to the thin film transistor TFT by way of source electrodes SD1, and the counter electrodes CT are also electrically connected to the counter lines CL. As shown, the pixel electrode crosses only one of the reference lines.

The pixel electrode PX and the counter electrode CT oppose each other and an optical condition of a liquid crystal composition LC is controlled by an electric field approximately parallel to the surface of the substrate which is generated between each pixel electrode PX and the counter electrode CT, and, hence, the display is controlled. The pixel electrodes PX and the counter electrodes CT are constructed like a comb and are respectively formed of thin electrodes elongated in an upward to downward direction in the drawing.

The electrode widths of the pixel electrodes PX and the counter electrodes CT are 6 μm respectively. This means that to apply a sufficient electric field to the entire liquid crystal layer in the direction of thickness of the liquid crystal layer, they are set to values sufficiently greater than 3.9 μm, which is the thickness of the liquid crystal composition layer, as will be explained later. They may preferably be set to 1.5 times greater than the thickness of the liquid crystal composition layer. Furthermore, to increase the aperture efficiency, they are made as thin as possible. Furthermore, the drain lines DL are also set to 6 μm. To prevent a disconnection, the electrode width of the drain line DL may be slightly widened compared to the pixel electrodes PX and the counter electrodes CT.

The width of the gate lines GL is set such that they meet a resistance value sufficient to propagate the scanning voltage to the gate electrode GT of the pixel at the tail end (side opposite to gate electrode terminals GTM which will be explained later). Furthermore, the width of the counter line CL is set such that it will have a resistance value sufficient to apply a counter voltage to the counter electrode CT of the pixel at the tail end (the pixel remotest from the common bus lines CB1, CB2 which will be explained later, namely, the pixel interposed between CB1 and CB2).

On the other hand, the electrode interval between the pixel electrode PX and the counter electrode CT varies depending on the liquid crystal material being used. This means that, since the intensity of the electric field which achieves the maximum transmissivity depends on the liquid crystal material, the electrode interval is set depending on the liquid crystal material, and the electrode interval is set such that the maximum transmissivity is obtained in a range of the maximum amplitude of the signal voltage set corresponding to the pressure resistance of the drain drive circuit (signal side driver) being used. In case a liquid material which will be explained later is used, the interval between electrodes is approximately 15 μm.

<<Cross Sectional Construction of the Matrix Portion (Pixel Portion)>>

Figure 2:
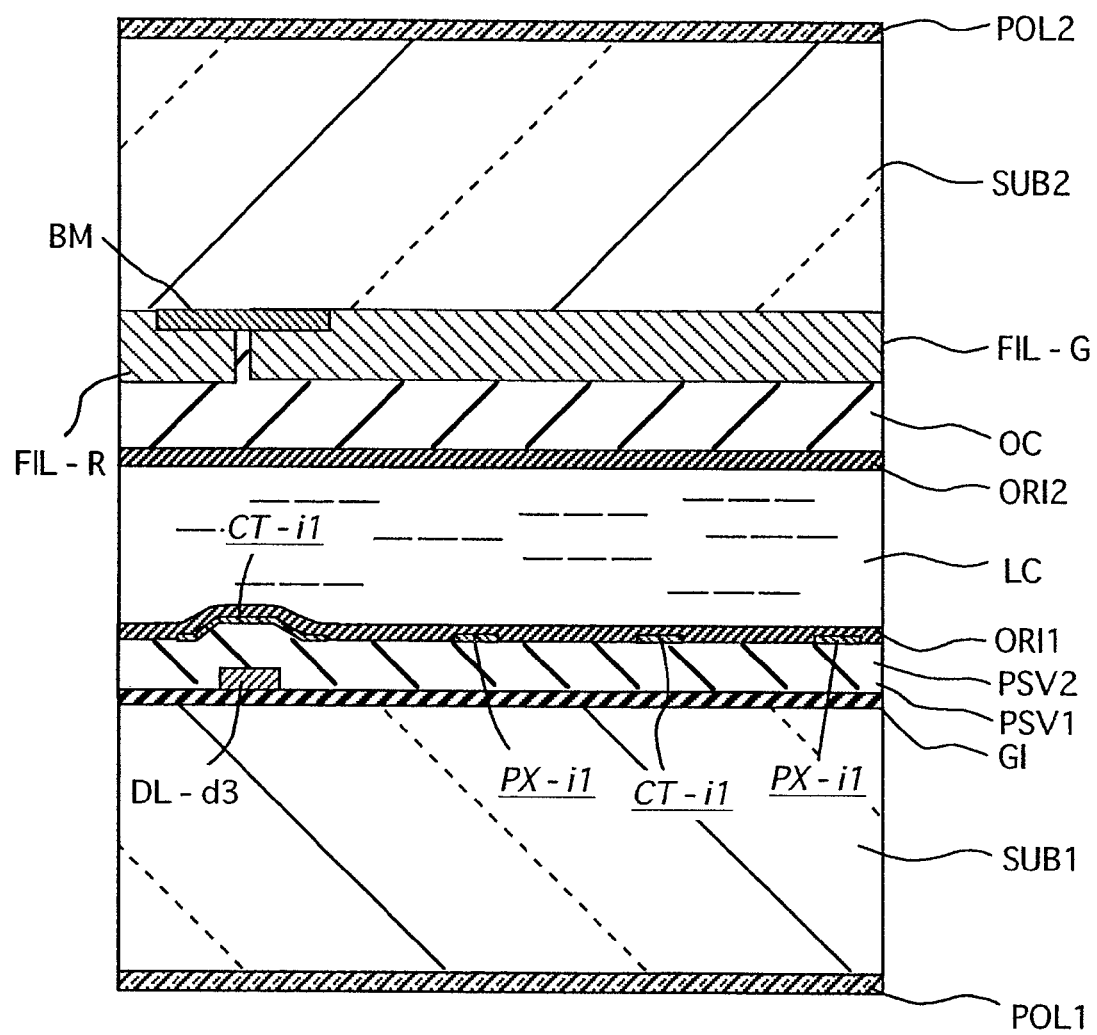
FIG. 2 is a cross sectional view of the pixel taken along a line 6-6 of FIG. 1.
Figure 3:
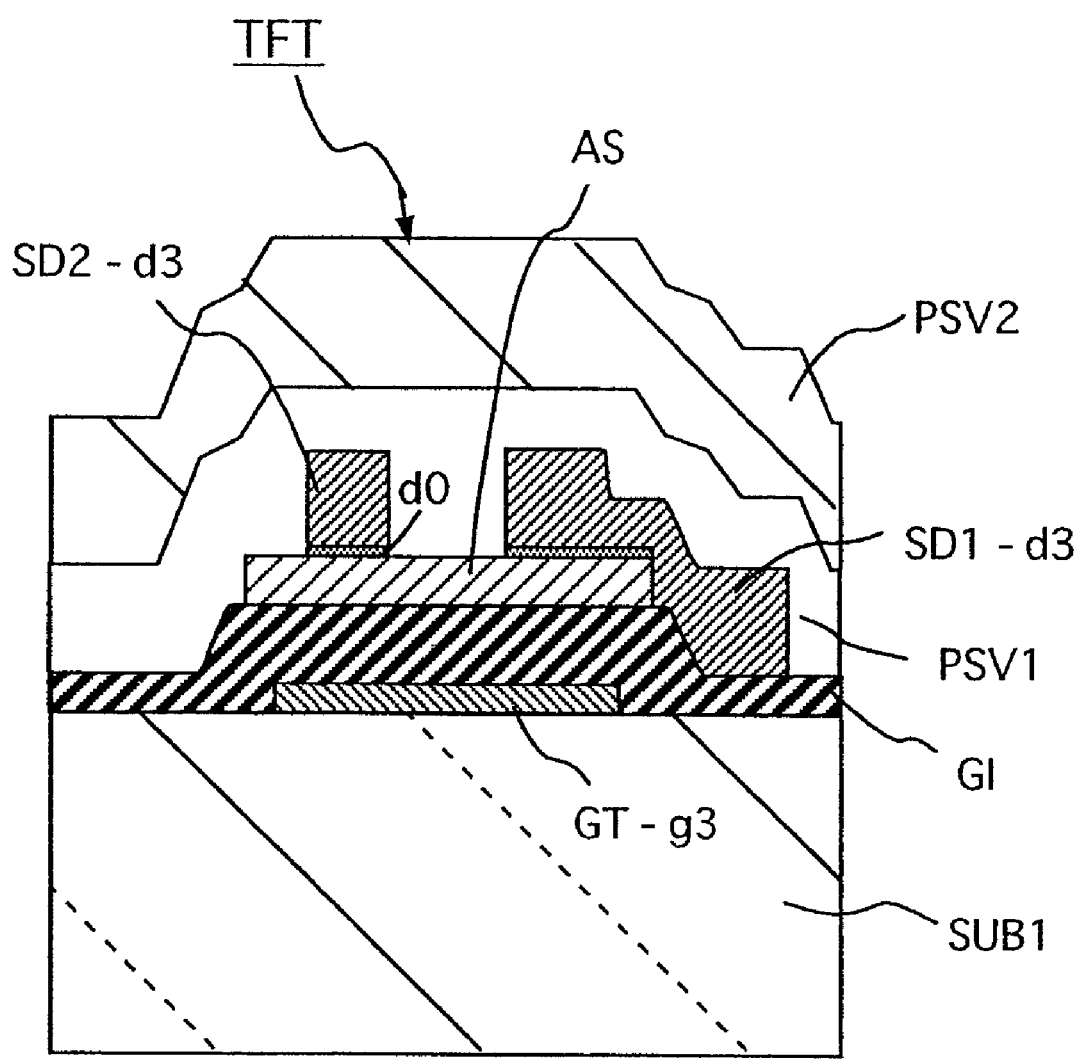
FIG. 3 is a cross sectional view of a thin film transistor element TFT taken along a line 7-7 of FIG. 1.
Figure 4:
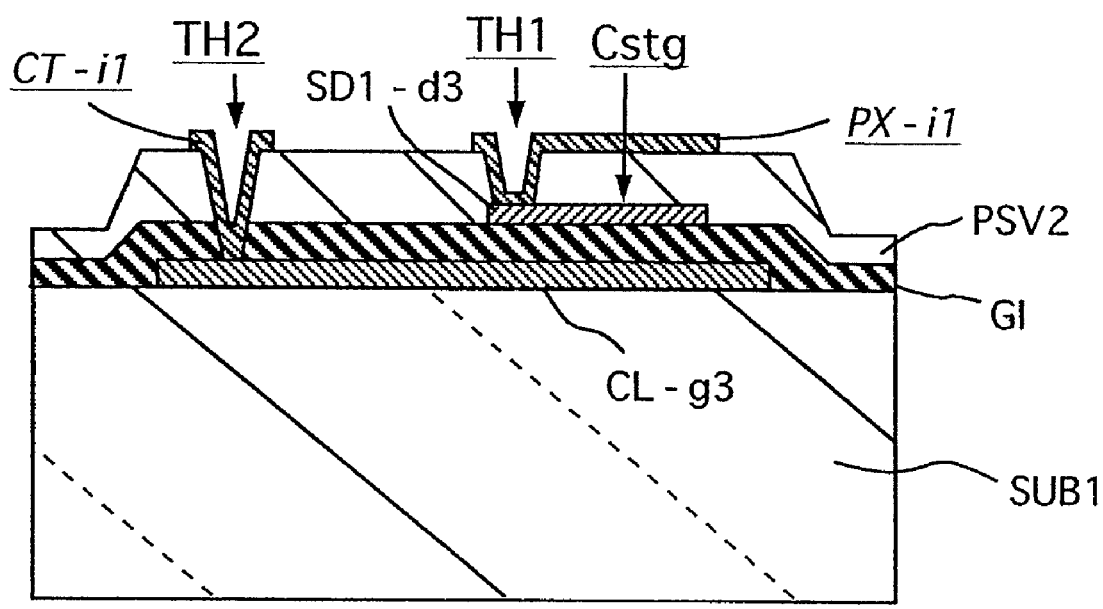
FIG. 4 is a cross sectional view of an accumulated capacitance Cstg taken along a line 8-8 of FIG. 1.

FIG. 2 is a view showing the cross section taken along a line 6-6 of FIG. 1, FIG. 3 is a cross sectional view of the thin film transistor TFT taken along a line 7-7 of FIG. 1, and FIG. 4 is a view showing the cross section of the storage capacitance Cstg taken along a line 8-8 of FIG. 1. As shown in FIG. 5 to FIG. 7B, with a liquid crystal composition layer LC as a reference, the thin film transistor TFT, the storage capacitance Cstg and a group of electrodes are formed at a lower portion transparent glass substrate SUB1 side, while a color filter FIL and a light blocking film (black matrix) BM are formed at an upper portion transparent glass substrate SUB2 side.

Furthermore, orientation films ORI1, ORI2 are mounted on respective surfaces of the inner sides (liquid crystal LC sides) of the transparent glass substrates SUB1, SUB2, which orientation films ORI1, ORI2 control the initial orientation of the liquid crystals, and on respective surfaces of the outer sides (liquid crystal LC sides) of the transparent glass substrates SUB1, SUB2, polarizing plates are mounted.

<<TFT Substrate>>

First of all, the construction of the lower-side transparent glass substrate SUB1 (TFT substrate) will be explained in detail.

<<Thin Film Transistor TFT>>

The thin film transistor TFT is operated such that when a positive bias is applied to the gate electrode GT, the channel resistance between the source and drain is reduced, and when the bias becomes zero, the channel resistance is increased.

As shown in FIG. 3, the thin film transistor TFT includes the gate electrode GT, an insulating film GI, an i-type semiconductor layer AS made of an i-type (intrinsic or not doped with conductive type determination impurities) amorphous silicon (Si), a pair of source electrodes SD1, and the drain electrodes SD2. The source and drain are originally determined based on the bias polarity between them, and the polarity is inverted during the operation of the circuit in this liquid crystal display device; and, hence, it should be understood that the source and drain are switched during operation. In the following explanation, however, for the sake of convenience, one is consistently referred to as the source, while the other is referred to as the drain.

<<Gate Electrode GT>>

The gate electrode GT is constructed such that it is contiguous with the gate line GL and a partial region of the gate line GL constitutes the gate electrode GT. The gate electrode GT is a portion which extends over an active region of the thin film transistor TFT. In this embodiment, the gate electrode GT is made of a conductive film g3 having a single layer construction. Although a chrome-molybdenum alloy (Cr—Mo) film formed by spattering may be used as the conductive film g3, for example, the film is not limited to such material.

<<Gate Line GL>>

The gate line GL is composed of the conductive film g3. The conductive film g3 of this gate line GL is formed in the same manufacturing step as the conductive film g3 of the gate electrode GT and is formed integrally with the conductive film g3 of the gate electrode GT. By means of this gate line GL, a gate voltage (a scanning voltage) Vg is supplied to the gate electrode GT from an external circuit. In this embodiment, a chrome-molybdenum alloy (Cr—Mo) film formed by spattering may be used as the conductive film g3, for example. Furthermore, the gate line GL and the gate electrode GT are not limited to the chrome-molybdenum alloy and may have a two layer structure in which aluminum or aluminum alloy is wrapped by chrome-molybdenum for lowering the resistance. Still furthermore, a portion where the drain line DL and the gate line GL intersect is made narrow to minimize the probability of a short circuit with drain line DL. Alternately, the portion may be bifurcated so as to be cut out by laser trimming even when short-circuiting occurs.

<<Counter Line CL>>

The counter line CL is composed of the conductive film g3. The conductive film g3 of this counter line CL is formed in the same step as the conductive films g3 of the gate electrode CT, the gate line GL and the counter electrode GT and is constructed to be electrically connected to the counter electrode CT. By means of this counter line CL, a counter voltage Vcom is supplied to the counter electrode CT from the outside. Furthermore, the counter line CL is not limited to the chrome-molybdenum alloy and may have a two layer structure in which aluminum or aluminum alloy is wrapped by chromemolybdenum for lowering the resistance. Still furthermore, a portion where the drain line DL and the counter line CL intersect is made narrow to minimize the probability of a short circuit with drain line DL. Alternately, the portion may be bifurcated so as to be cut out by laser trimming even when a short-circuit occurs.

<<Insulating Film GI>>

In the thin film transistor TFT, the insulating film GI is used as a gate insulating film for applying an electric field to the semiconductor layer AS together with the gate electrode GT. The insulating film GI is formed on the gate electrode GT and the upper layer of the gate line GL. As the insulating film GI, a silicon nitride film formed by a plasma CVD method, for example, can be chosen and the formed film has a thickness of 2000 4500 Å (approximately 3500 Å). Furthermore, the insulating film GI also works as an interlayer insulating film among the gate line GL, the counter line CL and the drain line DL, thus contributing to their electrical insulation.

<<i-Type Semiconductor Layer AS>>

The i-type semiconductor layer AS is made of an amorphous silicon and is formed to a thickness of 150-2500 Å (approximately 1200 Å in this embodiment). A layer d0 is a N(+) type amorphous silicon semiconductor layer doped with phosphor (P) for an ohmic contact and is retained only at positions where the i-type semiconductor layer AS is present at a lower side thereof and the conductive layer d3 is present at an upper side thereof.

The i-type semiconductor layers AS and the layer d0 are also provided between intersecting portions (crossover portions) of the gate line GL and the counter line CL with the drain line DL. The i-type semiconductor layers AS reduces the probability of short-circuiting of the gate line GL and the counter line CL with the drain line DL at these intersecting portions.

<<Source Electrode SD1, Drain Electrode SD2>>

The source electrode SD1 and the drain electrode SD2 are respectively formed of conductive films d3 which are brought into contact with the N(+) type semiconductor layer d0.

A chrome-molybdenum alloy (Cr—Mo) film formed by spattering is used as the conductive film d3 and the film is formed to a thickness of 500-3000 Å (approximately 2500 Å in this embodiment). Since the Co—Mo film has a low stress, it can be formed to have a relatively large thickness thus contributing to a lowering of the resistance of the wires. Furthermore, the Co—Mo film exhibits a favorable adhesiveness to the N(+) type semiconductor layer d0. As the conductive film d3, besides the Cr—Mo film, a high melting point metal (Mo, Ti, Ta, W) film or a high melting point metal silicide (MoSi2, TiSi2, TaSi2, WSi2) film can be used or the conductive film d3 may have a laminated structure with aluminum or the like.

<<Drain Line DL>>

The drain line DL is composed of a conductive layer d3 which is the same layer as the source electrode SD1 and the drain electrode SD2. Furthermore, the drain line DL is integrally formed with the drain electrode SD2. In this embodiment, a chrome-molybdenum alloy (Cr—Mo) film formed by spattering is used as the conductive film d3 and the film is formed to a thickness of 500-3000 Å (approximately 2500 Å in this embodiment). Since the Cr—Mo film has a low stress, it can be formed to have a relatively large thickness, thus contributing to a lowering of the resistance of the wires. Furthermore, the Cr—Mo film exhibits a favorable adhesiveness to the N(+) type semiconductor layer d0. As the conductive film d3, besides the Cr—Mo film, a high melting point metal (Mo, Ti, Ta, W) film or a high melting point metal silicide (MoSi2, TiSi2, TaSi2, WSi2) film can be used, or the conductive film d3 may have a laminated structure with aluminum or the like for preventing a disconnection.

<<Storage Capacitance Cstg>>

The conductive film d3 is formed such that it is overlapped or superposed onto the counter line CL at the source electrode SD2 of the thin film transistor TFT. As can be understood from FIG. 1, this overlapping constitutes the storage capacitance (electrostatic capacitance element) Cstg where the source electrode SD2-d3 defines one electrode and the counter line CL defines the other electrode. A dielectric film of this storage capacitance Cstg is constituted by the insulating film GI which is used as a gate insulating film of the thin film transistor TFT.

As shown in FIG. 1, in a plan view, the storage capacitance Cstg is formed at a portion of counter line CL.

<<Passivation Layer PSV1>>

The passivation layer PSV1 is mounted on the thin film transistor TFT. The passivation layer PSV1 is formed mainly for protecting the thin film transistor TFT from moisture or the like, and a layer having a high transparency and a favorable moisture resistance is used. The passivation layer PSV1 is constituted by a silicon oxide film or a silicon nitride film formed by a plasma CVD apparatus and the formed layer has a thickness of approximately 0.05-0.3 μm. Since the main purpose of providing the passivation layer PSV1 is to protect a back channel portion of the thin film transistor element TFT, that is, to stabilize a threshold voltage Vth, in this embodiment, the passivation layer PSV1 is formed like an island only at the thin film transistor TFT portion. Due to such a construction, warping of the substrate caused by the stress of the passivation layer PSV1 can be reduced.

The passivation layer PSV1 is removed such that external connection terminals DTM, GTM are exposed. With respect to the thickness relationship of the passivation layer PSV1 and the insulating film G1, the former is made thick in view of the protection effect and the latter is made thin in view of the mutual conductance gm of the transistor.

<<Organic Passivation Layer PSV2>>

The organic passivation layer PSV2 is mounted on the passivation layer PSV1. The organic passivation layer PSV2 is provided for the following purpose, and a film having a high transparency and a low specific dielectric constant of approximately 3 can be used. The organic passivation layer PSV2 is made of, for example, a resist film formed by a coating apparatus and the film thickness is approximately 1-3 μm. Due to such a construction, the capacitance between the drain line and the counter electrode which is overlapped on the drain line can be drastically reduced. Accordingly, the load to the drain line is drastically reduced and the magnitude of a circuit of a drive LSI for driving the drain signal can be drastically minimized. Furthermore, as explained previously in connection with the explanation of the OPERATION, the organic passivation layer PSV2 is useful in enhancing the flatness of the thin film transistor substrate. This is because the organic passivation layer can provide an improved flatness compared to the inorganic passivation layer.

The organic passivation layer PSV2 is removed such that the external connection terminals DTM, GTM are exposed. Furthermore, at the pixel portion, for assuring the electric connection between the counter line CL and the counter electrode CT, which will be explained later, and the electric connection between the source electrode SD2 and the pixel electrode PX, through holes TH2 and TH1 are formed. In the through hole TH2, the organic passivation layer PSV2 and the insulating film GI are worked simultaneously so that the through hole TH2 reaches the g3 layer, while in the through hole TH1, it is blocked by the film d3 so that the through hole TH1 reaches the d3 layer.

Although the organic passivation layer having a specific dielectric constant of approximately 3 is used in this embodiment, the specific dielectric constant is preferably not greater than 4 to obtain the effect of the present invention.

<<Pixel Electrode PX>>

The pixel electrode PX is made of a transparent conductive layer i1 and is formed on the organic passivation layer PSV2. This transparent conductive film i1 is made of a transparent conductive film (Indium-Tin-Oxide ITO: nesa film) which is formed by spattering and the formed film has a thickness of 100-2000 Å (approximately 1400 Å in this embodiment). Furthermore, the pixel electrode PX is connected to the source electrode SD2 by way of the through hole TH1.

Since the pixel electrode becomes transparent in this embodiment, due to the transmitted light through that portion, the maximum dielectric constant at the time of making a white display is enhanced, and, hence, such a pixel electrode can provide a brighter display than an opaque pixel electrode. Here, as will be explained later, when no voltage is applied, liquid crystal molecules maintain the initial orientation condition, and since the polarizing plate is constructed such that the black display is made under such a condition (changed to a normally black mode), even when the pixel electrode is made transparent, no light is transmitted through the portion, and, hence, a high quality black can be displayed. Accordingly, the maximum dielectric constant can be enhanced and a sufficient contrast can be achieved.

<<Counter Electrode CT>>

The counter electrode CT is made of a transparent conductive layer i1 and is formed on the organic passivation layer PSV2. This transparent conductive film i1 is made of a transparent conductive film (Indium-Tin-Oxide ITO: nesa film) which is formed by spattering and the formed film has a thickness of 100-2000 Å (approximately 1400 Å in this embodiment). Furthermore, the counter electrode CT is connected to the counter line CL by way of the through hole TH2. As is the case with the pixel electrode PX, by making the counter electrode transparent, the maximum transmissivity at the time of the white display can be enhanced. Furthermore, the drain line DL is completely covered by the counter electrode CT and most of the lines of electric force are terminated at the counter electrode CT. Due to such a construction, the leakage electric field from the drain line peculiar to the transverse electric field system can be completely eliminated thus completely dissolving any crosstalk. This is a special effect of the active matrix system liquid crystal display device using the transverse electric field system.

Furthermore, the device is constructed in such a way that the counter voltage Vcom is applied to the counter electrode CT. In this embodiment, the counter voltage Vcom is set to a potential which is lower than an intermediate direct current potential between the minimum level drive voltage Vdmin and the maximum level drive voltage Vdmax applied to the drain line DL by a field through voltage ΔVs generated when the thin film transistor element TFT is turned off.

<<Color Filter Substrate>>

Looking again to FIG. 1 and FIG. 2, the construction of the upper-side transparent glass substrate SUB2 side (color filter substrate) will be explained in detail.

<<Light Blocking Film BM>>

At the upper-side transparent glass substrate SUB2 side, the light blocking film BM (a so-called black matrix) is formed so as prevent a lowering of the contrast ratio which may be caused by transmitted light being emitted from unnecessary gap portions (gaps other than gaps between the pixel electrode PX and the counter electrode CT) onto the display surface side. The light blocking film BM also plays a role of preventing the outdoor daytime light and a back light from entering the i-type semiconductor layer AS. That is, the i-type semiconductor layer AS of the thin film transistor TFT is sandwiched by the light blocking film BM and the relatively larger gate electrode GT, which are disposed above and below the layer, thus preventing the outdoor natural light and the back light from being emitted to the layer.

FIG. 1 shows one example of the pattern of the light blocking film BM.

In this embodiment, the pattern is a matrix-like pattern forming apertures on the display portion of the pixel. In this embodiment, the light blocking film BM is made of a chromium thin film. On the glass surface side of the chromium thin film, chromium oxide or chromium nitride is formed. This is provided for reducing the reflectance thus making the display surf ace of the liquid crystal display device low-reflecting.

Furthermore, respective effective display regions defined by respective lines and rows are partitioned by this light blocking film BM. Accordingly, the profile of the pixel of the respective row can be clearly defined by the light blocking film BM.

Furthermore, the light blocking film BM is formed like a frame on the peripheral portion and its pattern is formed contiguously with the Pattern of the matrix portion shown in FIG. 1. The light blocking film BM of the peripheral portion is extended outside of the seal portion SL thus preventing the leakage of light, such as reflected light or the like caused by apparatuses including personal computers on which the liquid crystal display device is mounted from entering the matrix portion and preventing the light such as the back light or the like from leaking to the outside of the display area. On the other hand, this light blocking film BM is held inwardly from the margin of the substrate SUB2 by approximately 0.3-1.0 mm and is formed while obviating the cut-out region of the substrate SUB2.

In this embodiment, although a metal film which has a high light blocking effect irrespective of its being thin is used, an insulating light blocking film may be used provided that it has a sufficient light blocking effect.

<<Color Filter FIL>>

Color filters FIL are formed in stripes at positions opposed to the pixels, wherein the color filters appear repeatedly as red, green and blue stripes. Color filters FIL are formed in such a way that they overlap on edge portions of the light blocking film BM.

The color filters FIL can be formed in the following manner. First of all, a dyeing base material such as an acrylic based resin is formed on the surface of the upper transparent glass substrate SUB2. The dyeing base material other than the red filter forming region is removed by a photolithography technique. Thereafter, the dyeing base material is dyed by a red pigment and a fixing processing is applied so as to form the red filter R. Subsequently, by applying similar processes, a green filter G and a blue filter B are formed in sequence. A dyestuff may be used for dyeing.

<<Overcoat Film OC>>

The overcoat film OC is provided for preventing the leakage of the dyestuff of the color filter FIL into the liquid crystal composition layer LC and for flattening the step caused by the color filter FIL and the light blocking film BM. The overcoat film OC is formed of a transparent resin material, such as an acrylic resin or epoxy resin or the like. Furthermore, an organic passivation layer, such as a polyimide or the like, having a favorable fluidity may be used as the overcoat film OC.

<Liquid Crystal Layer and Polarizing Plate>

Subsequently, the liquid crystal layer, the orientation film and the polarizing plates and the like will be explained.

<<Liquid Crystal Layer>>

As the liquid crystal material LC, a nematic liquid crystal with its anisotropy of dielectric constant $\Delta\in$ being positive and its value being 13.2 and its refractive index anisotropy $\Delta n$ being 0.081 (589 nm, 20° C.) is used. The liquid crystal layer has a thickness (gap) of 3.9 μm and a retardation $\Delta n \cdot d$ of 0.316. With such a value of the retardation $\Delta n \cdot d$, when the orientation film, which will be explained later, and the polarizing plate are combined and the liquid crystal molecules are rotated from the rubbing direction to the electric field direction by 45°, the maximum dielectric constant can be obtained, and, hence, transmitting light which has no wavelength dependency within a range of visible light can be obtained. The range of retardation is preferably in the range of 0.25-0.32 μm to obtain a sufficient transmission term. The thickness (gap) of the liquid crystal layer is controlled by polymer beads.

The liquid crystal material LC is not specifically limited to a particular material and its anisotropy of dielectric constant $\Delta\in$ may be negative. Furthermore, the greater the value of its anisotropy of dielectric constant $\Delta\in$, the more the drive voltage can be reduced. Furthermore, the smaller its refractive index anisotropy $\Delta n$, the more the thickness (gap) of the liquid crystal layer can be made thicker, and, hence, the liquid crystal fill-in time can be shortened and the irregularities of the gap can be minimized.

As the specific resistance of the liquid crystal composition, a value equal to or more than $10^9$ Ωcm and not greater than $10^{14}$ Ωcm, or preferably a value equal to or more than $10^{11}$ Ωcm and not greater than $10^{13}$ Ωcm, may be used. According to this method, even when the resistance of the liquid crystal composition is low, the voltage applied between the pixel electrode and the counter electrode can be sufficiently maintained, and its lower limit is $10^9$ Ωcm and preferably $10^{11}$ Ωcm. This is based on a construction wherein the pixel electrode and the counter electrode are constructed on the same substrate. Furthermore, when the resistance is too high, it is difficult to alleviate the problem of static electricity which has entered in the manufacturing process, and, hence, the specific resistance should be not greater than $10^{14}$ Ωcm and preferably not greater than $10^{13}$ Ωcm.

Furthermore, the twist elastic constant K2 of the liquid crystal material should preferably be small; to be more specific, it should be not less than 2pN.

<<Orientation Film>>

Polyimide is used as the orientation film ORI. The rubbing directions are parallel to each other between the upper and lower substrates and an angle which the orientation film OPI makes with an electric field applying direction is set to 75°.

The angle which the rubbing direction and the electric field applying direction make is equal to or more than 45° and less than 90° when the anisotropy of dielectric constant $\Delta\in$ of the liquid crystal material is positive, while the angle is not less than 0° and greater than 45° when the anisotropy of dielectric constant $\Delta\in$ is negative.

<<Polarizing Plate>>

As the polarizing plate POL, G1220DU manufactured by Nitto Denko Ltd. is used and the polarized light transmission axis MAX1 of the lower polarized plate POLL is registered or aligned with the rubbing direction RDR, while the polarized light transmission axis MAX2 of the upper polarized plate POL2 is disposed perpendicular to the rubbing direction RDR. Due to such an arrangement, normally closed characteristics can be obtained, in which, corresponding to an increase of the voltage (voltage between the pixel electrode PX and the counter electrode CT) applied to the pixel of the present invention, the dielectric constant is increased. Furthermore, when the voltage is not applied to the pixel, a high quality black display can be obtained. The relationship between the upper and lower polarized plates can be inverted and no substantial change takes place in characteristics by such an inversion.

According to this embodiment, a conductivity is given to the polarized plates such that the polarized plates can cope with a poor display or EMI caused by static electricity from the outside. With respect to the conductivity, in case when it is sufficient for the polarized plates to cope with only the problem of static electricity, the sheet resistance is preferably not greater than $10^8$Ω/□; while, in the case where the polarized plates have to cope with EMI too, the sheet resistance is preferably not greater than $10^4$Ω/□. Furthermore, a conductive layer may be mounted on a rear surface (surface to which a polarized plate is adhered) opposite to the surface of the glass substrate for sandwiching the liquid crystal composition.

<<Construction Around the Matrix>>

Figure 5:
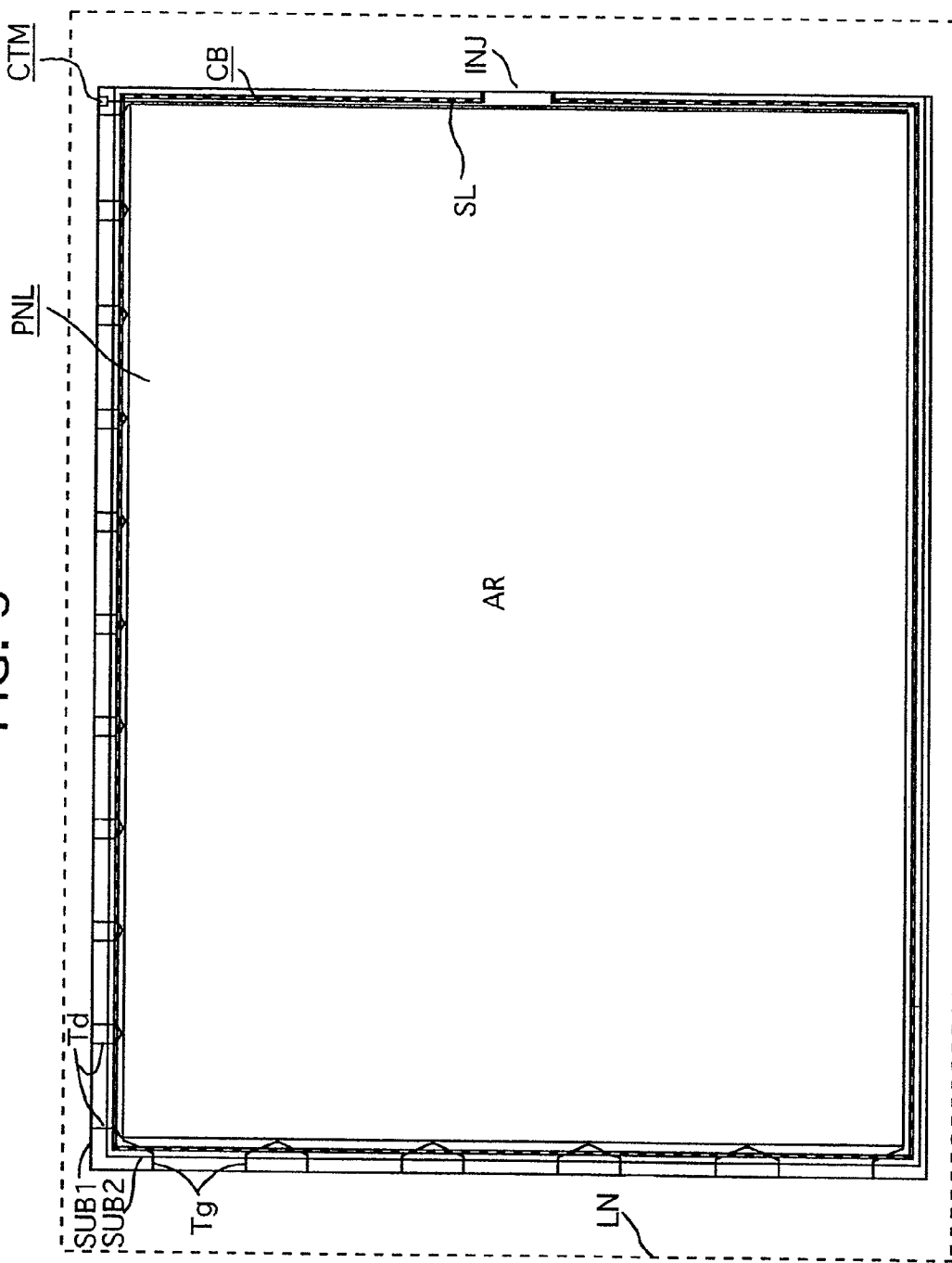
FIG. 5 is a plan view showing the construction of a matrix peripheral portion of a display panel.
Figure 6:
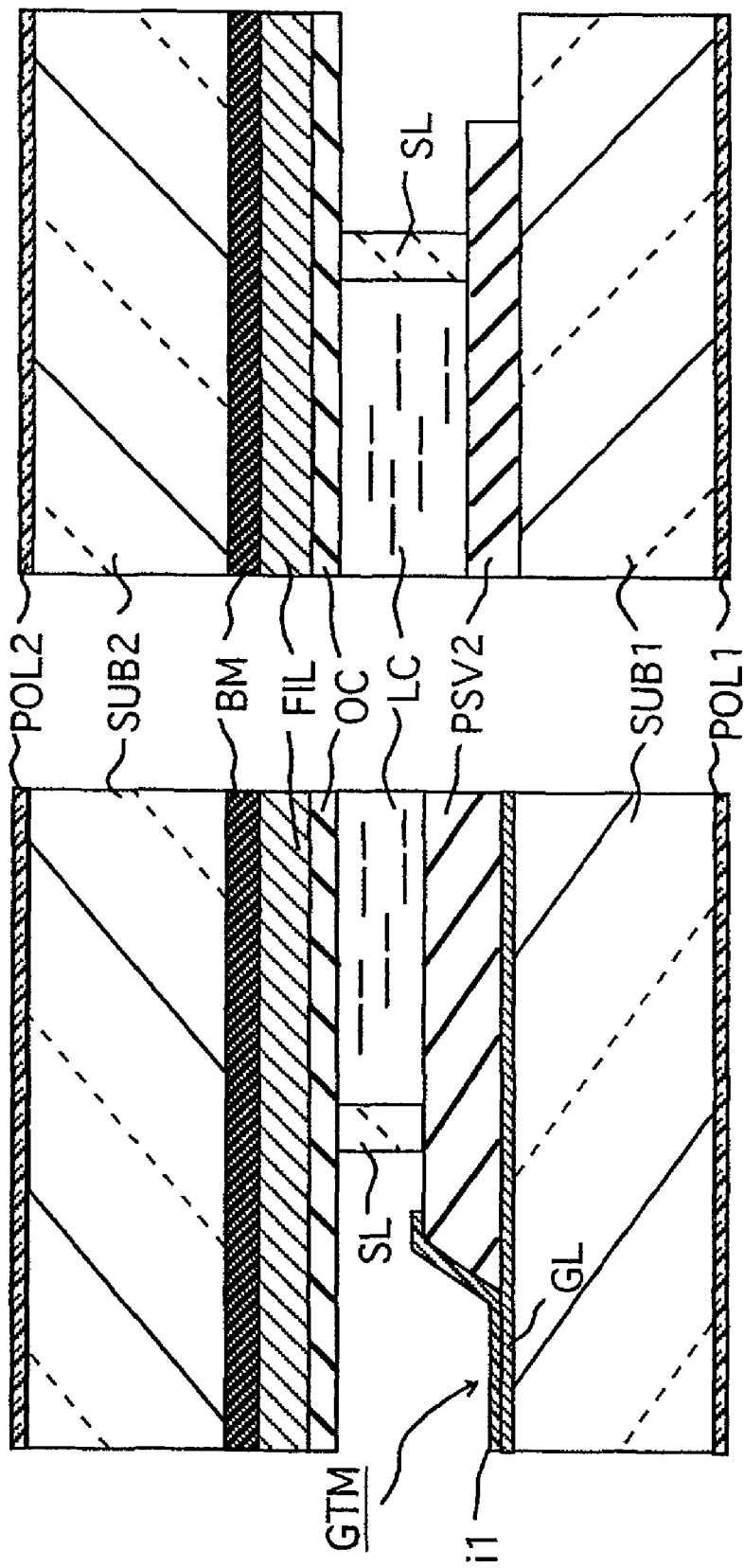
FIG. 6 is a cross sectional view of a panel marginal portion without scanning signal terminals at the left side and external connecting terminals at the right side.

FIG. 5 is a plan view showing the essential portions around the matrix (AR) of the display panel PNL including the upper and lower glass substrates SUB1, SUB2. Furthermore, FIG. 6 is a view showing the cross section in the vicinity of the external connection terminals GTM to which the scanning circuit is connected at its left side and the cross section in the vicinity of the sealed portion where no external connection terminals are provided at its right side.

In manufacturing this panel, in case the size of the panel is small, for enhancing the throughput, a plurality of devices are simultaneously processed on a single glass substrate and then they are divided; while, in case the size of the panel is large, for facilitating the common use of the manufacturing facility, in any kinds of panels, a glass substrate having a standardized size is processed and it is reduced to a size corresponding to the respective kind of panel. In both cases, after subjecting the glass substrate to a set of steps, the glass is cut. FIG. 5 and FIG. 6 show the latter example. Both FIG. 5 and FIG. 6 show the upper and lower substrates SUB1, SUB2 after cutting, wherein LN shows the margin of both substrates before cutting. In both cases, under a finished product condition, at portions (an upper side and a left side in the drawing) where a group of external connecting terminals Tg, Td and a terminal COT (suffix being omitted) are present, to expose these to the outside, the size of the upper substrate SUB2 is restricted such that it is disposed toward the inside by a greater extent than the lower substrate SUB1. The group of terminals Tg, Td are respectively designated by assembling a plurality of scanning circuit connecting terminals GTM, image signal circuit connecting terminals DTM and drawing wiring portions, which will be explained later, for a unit of the tape carrier package TCP (see FIG. 16, FIG. 17) on which integral circuit chips CHI are mounted. The drawing wirings of each group extending from the matrix portion to the external connecting terminal portion are inclined as they approach both ends. This arrangement is provided for making the terminals DTM, GTN of the display panel PNL match the arranged pitch of the package TCP and the connecting terminal pitch at the respective package TCP. Furthermore, counter electrode terminals COT are provided for applying a counter voltage to the counter electrodes CT from the external circuit. The counter lines CL of the matrix portion are drawn out to the side (right side in the drawing) opposite to the scanning circuit terminals GTM and respective counter lines are bundled at the common bus line CB and are connected to the counter electrodes COT.

Between the transparent glass substrates SUB1, SUB2, along margins thereof, a seal pattern SL which seals the liquid crystal LC is formed except for a liquid crystal filling inlet INJ. The seal member may be made of epoxy resin, for example.

Layers which constitute the orientation films ORI1, ORI2 are formed inside the seal pattern SL. The polarizing plates POL1, POL2 are respectively provided on the outside surfaces of the lower transparent glass substrate SUB1 and the upper transparent glass substrate SUB2. The liquid crystal LC is filled in a region partitioned by the seal pattern SL between the lower orientation film ORI1 and the upper orientation film ORI2, which determine the direction of the liquid crystal molecules. The lower orientation film ORI1 is formed on the upper portion of the passivation layer PSV1 of the lower transparent glass substrate SUB1 side.

This liquid crystal display device is assembled in such a way that different kinds of layers are respectively stacked at the lower transparent glass substrate SUB1 side and the upper transparent glass substrate SUB2 side, the seal pattern SL is formed on the substrate SUB2 side, the lower transparent glass substrate SUB1 and the upper transparent glass substrate SUB2 are overlapped, the liquid crystal LC is filled through the opening portion INJ of the seal member SL, the fill-in inlet INJ is closed by epoxy resin or the like, and the upper and the lower substrates are cut.

<<Gate Terminal Portion>>

FIGS. 7A and 7B show the connection structure of the display matrix from the gate line GL to the external connecting terminals GTM, wherein FIG. 7A is a plan view and FIG. 7B is a cross-sectional view taken along a line VIIB-VIIB of FIG. 7A. These views correspond to a lower portion or the vicinity of the lower portion of FIG. 5 and the hatched wiring portion is expressed by a single straight line for the sake of convenience.

In the drawing, for facilitating the understanding of the invention, hatching is provided to a Cr—Mo layer g3.

The gate terminal GTM is comprised of the Cr—Mo layer g3 and the transparent conductive layer i1, which protects the surface of the Cr—Mo layer g3 and enhances the reliability of its connection with the TCP (Tape Carrier Package). This transparent conductive layer i1 employs the transparent conductive film ITO formed by the same step as that of the pixel electrode PX.

In plan view, an insulating film GI and the passivation layer PSV1 are formed at the right side from the border line, while the terminal portion GTM which is positioned at the left end side is exposed therefrom so as to be electrically brought into contact with an outer circuit. Although only a pair of the gate line GL and the gate terminal are shown in the drawing, in an actual use, these pairs are arranged in plural numbers in an upward and downward direction, thus constituting the group of terminals Tg (see FIG. 5); and, during the manufacturing process, the left ends of the gate terminals are extended over a cutting region of the substrates and are short-circuited by wiring SHg (not shown in the drawings). This feature is useful for prevention of electrostatic breakdown at the time of rubbing of the orientation film ORI1 during the manufacturing process.

<<Drain Terminal DTM>>

FIGS. 8A and 8B show the connection from the drain line DL to the external connection terminals DTM, wherein FIG. 8A is a plan view and FIG. 8B is a cross-sectional view taken along a line VIIIB-VIIIB of FIG. 8A. These views correspond to a right upper portion and the vicinity of the right upper portion of FIG. 5 and the right end direction corresponds to the upper end portion of the substrate SUB1 although the direction of the drawing is changed for the sake of convenience.

TSTd indicates detection terminals. Although the external circuit is not connected here, the width thereof is wider than the wiring portion so as to allow a probe needle to be brought into contact with the detection terminal. In the same manner, the width of the drain terminal DTM is also wider than the wiring portion so as to allow the drain terminals DTM to be brought into contact with the external circuit. The external connection drain terminals DTM are arranged in an upward to downward direction. The drain terminals DTM, as shown in FIG. 5, constitute a group of terminals Td (suffix being omitted) and they are extended over the cutting line of the substrate SUB1. The drain terminals DTM are all short-circuited by the wiring SHd, which is not shown in the drawing, so as to prevent electrostatic breakdown during the manufacturing process. The detection terminals TSTD are formed into the drain lines DL which are arranged as every other one as shown in FIG. 8A.

The drain connection terminals DTM are made of transparent conductive layers i1, and portions thereof, where the passivation layers PSV1 are removed, are connected to the drain lines DL. This transparent conductive film i1 uses the transparent conductive film ITO formed by the same process as that of the pixel electrode PX, as is the case of gate terminals GTM.

The draw-out line from the matrix portion to the drain terminal portion DTM is communicated by the layer d3 of the same level as the drain line DL.

<<Counter Electrode Terminal CTM>>

FIGS. 9A and 9B show the connection from the counter line CL to the external connection terminals CTM, wherein FIG. 9A is a plan view and FIG. 9B is a cross-sectional view taken along a line IXB-IXB of FIG. 9A. These drawings correspond to a left upper portion and the vicinity of the left upper portion of FIG. 5.

Respective counter lines CL are bundled at the common bus line CB1 and are drawn out to the counter electrode terminals CTM. The common bus line CB is constructed such that the conductive layer d3 is laminated on the conductive layer g3 and they are electrically connected with each other by the transparent conductive layer i1. This is because the resistance of the common bus line CB is reduced, and, hence, the counter voltage is sufficiently supplied to respective counter lines CL from the external circuit. This structure is characterized in that the resistance of the common bus can be reduced without providing any new conductive layer specifically.

The counter electrode terminal CTM has a structure such that the transparent conductive layer i1 is laminated on the conductive layer g3. This transparent conductive film i1 adopts the transparent conductive film ITO formed in the same step as the pixel electrode PX as is the case of other terminals. The counter electrode terminal CTM has the surface thereof covered by the transparent conductive layer i1 and the conductive layer g3 is covered with the transparent conductive layer i1 having a durability for preventing electrolytic corrosion. Furthermore, the connection of the transparent conductive layer i1 with the conductive layer g3 and the conductive layer d3 is effected to assure communication by forming through holes to the passivation layer PSV1 and the insulating film GI.

Figure 10A:
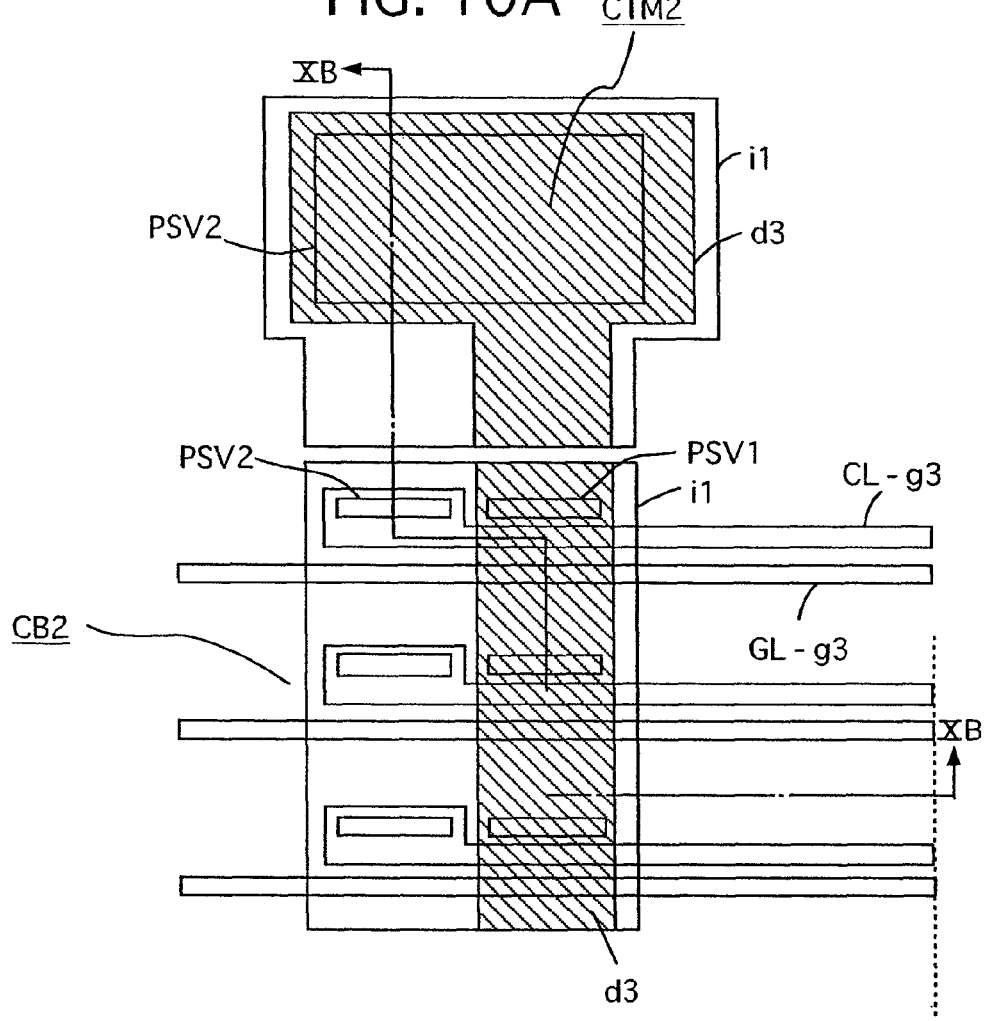
FIGS. 10A and 10B are plan and cross sectional views, respectively, showing the vicinity of a connecting portion between a common electrode terminal CTM2, a common bus line CB2 and a common voltage signal line CL.
Figure 10B:
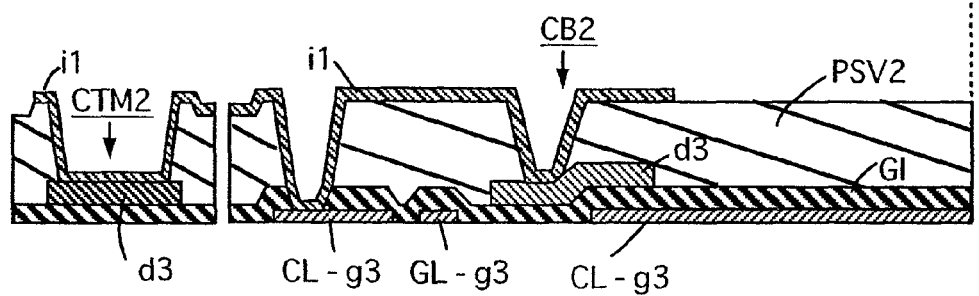

On the other hand, FIGS. 10A and 10B show the connection from another end of the counter line CL to the external connection terminals CTM2, wherein FIG. 10A is a plan view and FIG. 10B is a cross-sectional view taken along a line XB-XB of FIG. 10A. These drawings correspond to a right upper portion and the vicinity of the right upper portion of FIG. 5. Here, respective counter lines CL have other ends thereof (gate terminal GTM side) bundled at the common bus line CB2 and are drawn out to the counter electrode terminals CTM2. The common bus line CB2 differs from the common bus line CBI in that it is comprised of the conductive layer d3 and the transparent conductive layer i1 so as to be insulated from the gate line GL. Furthermore, the insulation against the gate line GL is assured by the insulating film GI.

<<Equivalent Circuit of Whole Display Device>>

Figure 11:
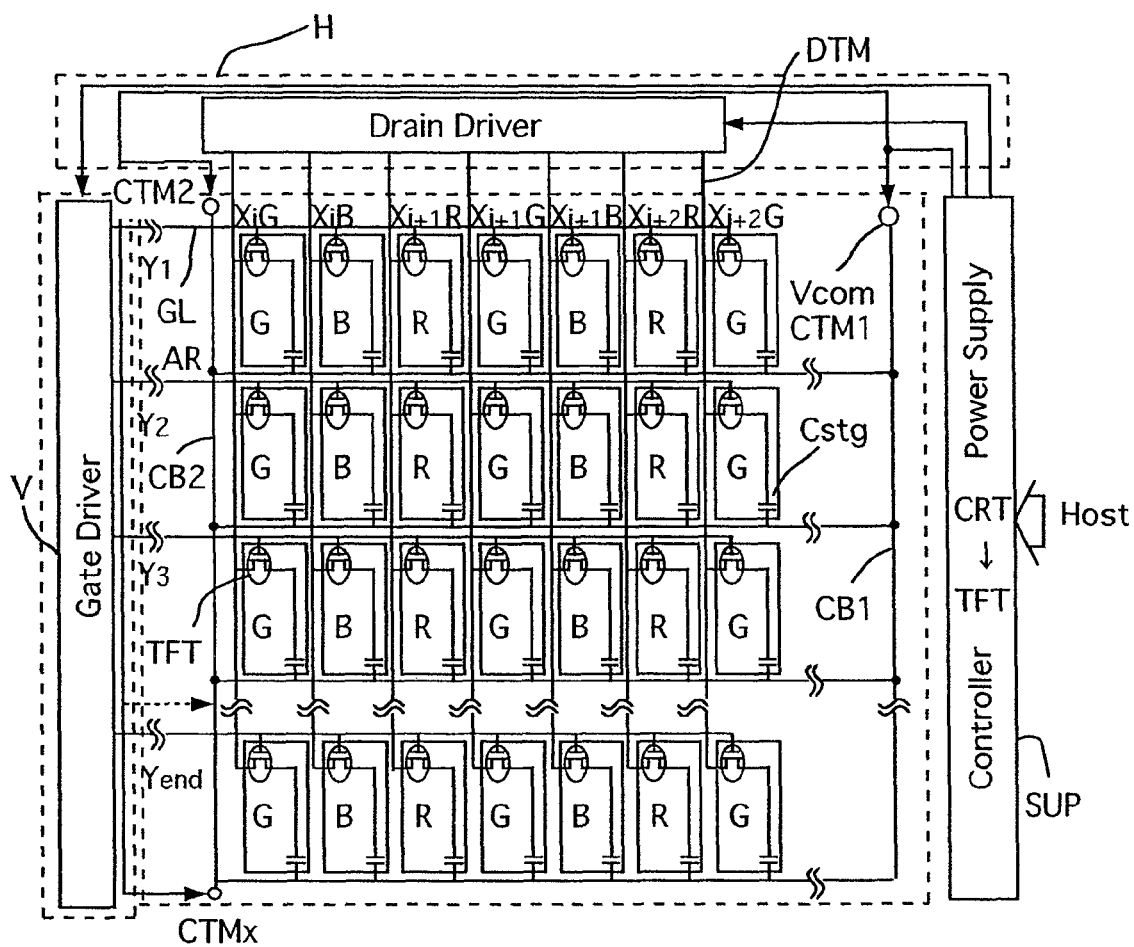
FIG. 11 is a circuit block diagram of the matrix portion and its periphery of the active matrix system color liquid crystal display device of the present invention.

The equivalent circuit of the display matrix portion and a wiring view of its peripheral circuit are shown in FIG. 11. Although the drawing is a circuit diagram, it is illustrated to show an actual physical geometric arrangement. AR is a matrix array where a plurality of pixels are arranged in a two dimensional manner.

In the drawings, X indicates a drain line DL, and suffixes G, B and R are added respectively corresponding to green, blue and red pixels. Y indicates a gate line GL and suffixes 1, 2, 3 . . . , and are added in accordance with the sequence of the scanning timing.

Gate lines Y (suffixed omitted) are connected to a gate driver V and drain lines X (suffix omitted) are connected to a drain driver H.

SUP is a circuit which includes a power source circuit to obtain a plurality of partial-pressure stabilized voltage sources from one voltage source and a circuit which changes information for a CRT (cathode ray tube) from a host (superior arithmetic unit) to information for TFT liquid crystal display device.

<<Drive Method>>

Figure 12:
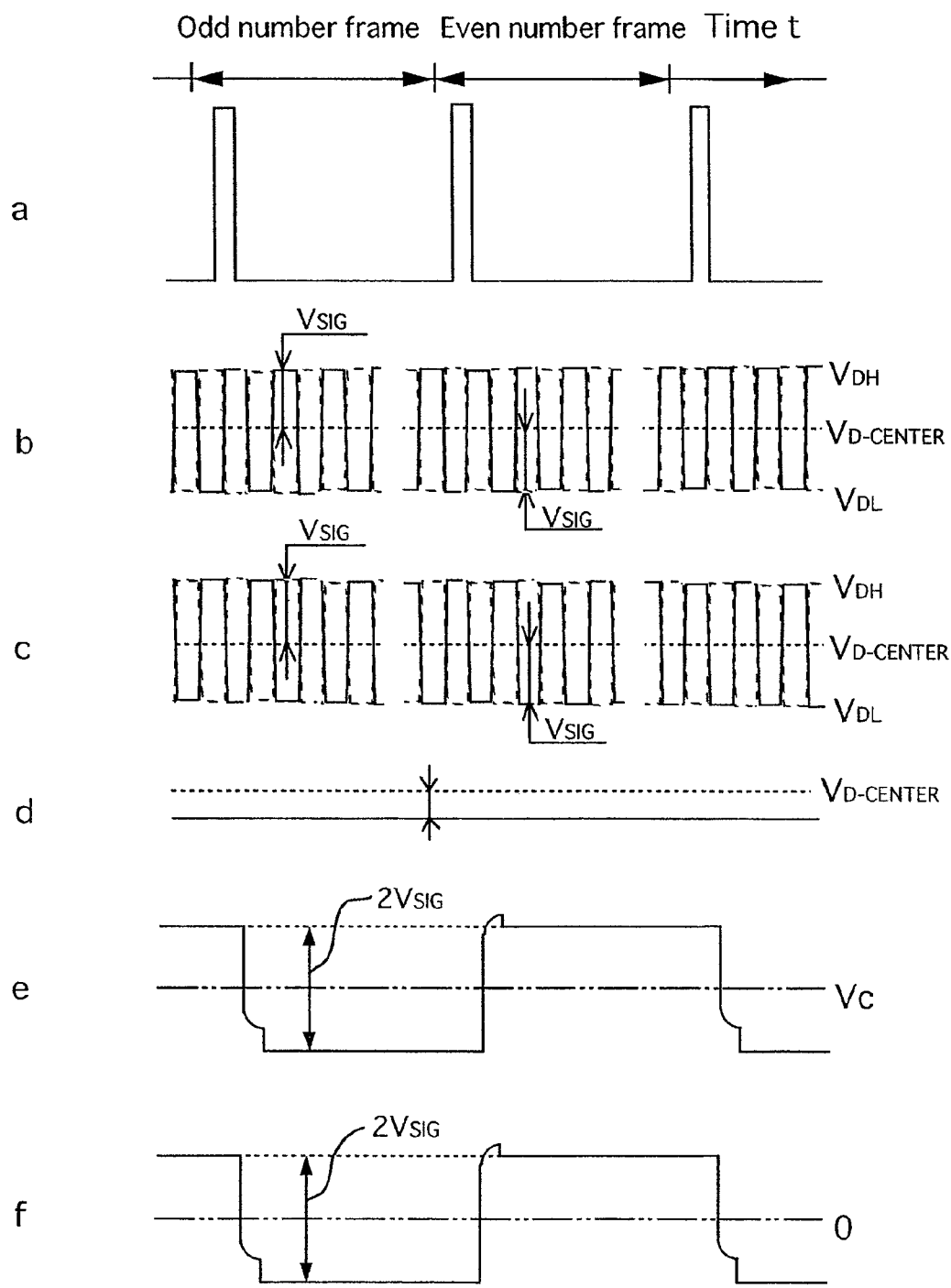
FIG. 12 is a waveform diagram showing a drive waveform of the active matrix system color liquid crystal display device of FIG. 1.

In FIG. 12, drive waveforms of the liquid crystal display apparatus of this embodiment are shown. A counter voltage Vch is set to a constant voltage. A scanning signal Vg takes an ON level at each scan period and takes an OFF level in the remaining period. An image signal voltage is applied in such a way that it has an amplitude which is twice as large as that of a voltage to be applied to the liquid crystal layer and its positive pole and negative pole are alternately inverted at each frame to transmit one pixel. Here, the image signal voltage Vd has its polarity changed at each row and the polarity is also inverted at each line. Accordingly, the pixels are arranged such that the pixels which are neighboring to one pixel in the upward and downward directions as well as in left and right directions have an inverted polarity, and, hence, flicker and crosstalk (smear in a left and right directions) hardly occur. Furthermore, the counter voltage Vc is set to a voltage which is a given amount lower than the center voltage, with an inverted polarity of the image signal voltage. This is performed so as to correct a field through voltage which is generated at the time that the thin film transistor element is changed over from ON to OFF and is also used to apply an alternating current voltage having little direct current component to the liquid crystal (since the liquid crystal often generates a residual image or a deterioration of an image when a direct current is applied to the liquid crystal).

<<Operation of Storage Capacitance Cstg>>

The storage capacitance Cstg is provided for storing image information written in the pixels for a long period of time (after the thin film transistor TFT is turned off). According to the system of the present invention, which applies an electric field parallel to the surface of a substrate, in contrast to the system which applies an electric field perpendicular to the surface of the substrate, there is almost no capacitance constituted by the pixel and the counter electrode (so-called liquid crystal capacitance); and, hence, the storage capacitance Cstg stores no image information in the pixel. Accordingly, in the system which applies the electric field parallel to the surface of the substrate, the storage capacitance Cstg is an inevitable constructional element.

Furthermore, when the thin film transistor TFT is switched, the storage capacitance Cstg also works to reduce the influence produced by a change of the gate potential $\Delta Vg$ on the pixel electrode potential Vs. This situation can be expressed by the following formula.

$$\Delta Vs \, Cgs/(Cgs+Cstg+Cpix)\} \times \Delta vg$$

Here, Cgs indicates a parasitic capacitance generated between the gate electrode GT and the source electrode SD1 of the thin film transistor TFT, Cpix indicates a capacitance generated between the pixel electrode PX and the counter electrode CT, and $\Delta Vs$ indicates an amount of change of the pixel electrode potential caused by $\Delta Vg$, or a so-called feed through voltage. Although this amount of change $\Delta Vs$ becomes a cause of a direct current component applied to the liquid crystal LC, corresponding to the increase of the holding capacitance Cstg, this value can be made smaller. Once the direct current component applied to the liquid crystal LC is reduced, the life of the liquid crystal LC is prolonged, and a so-called sticking phenomenon which retains a previous image at the time of switching the liquid crystal display screen can be reduced.

As mentioned previously, the gate electrode GT is made larger than the i-type semiconductor layer AS so as to completely cover the i-type semiconductor layer AS so that area thereof which overlaps the source electrode SD1 and the drain electrode SD2 is increased by an amount relative to the i-type semiconductor layer AS. Accordingly, the parasitic capacitance Cgs is increased, and an adverse effect is produced in that the pixel electrode potential Vs is liable to be subject to the influence of the gate (scanning) signal Vg. With the provision of the storage capacitance Cstg, this problem can be resolved.

<<Manufacturing Method>>

Subsequently, a method for manufacturing the substrate SUB1 side of the above-mentioned liquid crystal display device will be explained with reference to FIG. 13 to FIG. 15. In these drawings, words at the center are abbreviations of steps, the left side shows the processing flow carried out on a portion of the thin film transistor TFT shown in FIG. 3 in cross section, and the right side shows the processing flow carried out on the portion around the gate terminal shown in FIG. 7 in cross section. Except for the step B and the step D, steps A-G are divided corresponding to the respective photographic treatment, and respective cross-sectional views of respective steps show stages where the working after photographic treatment is finished and the photoresist is removed. Here, the photographic treatment involves a series of processing steps from application of the photoresist to a developing by way of a selective exposure using a mask, and a repeated explanation is obviated. The method is explained on the basis of the divided steps.

Figure 13:
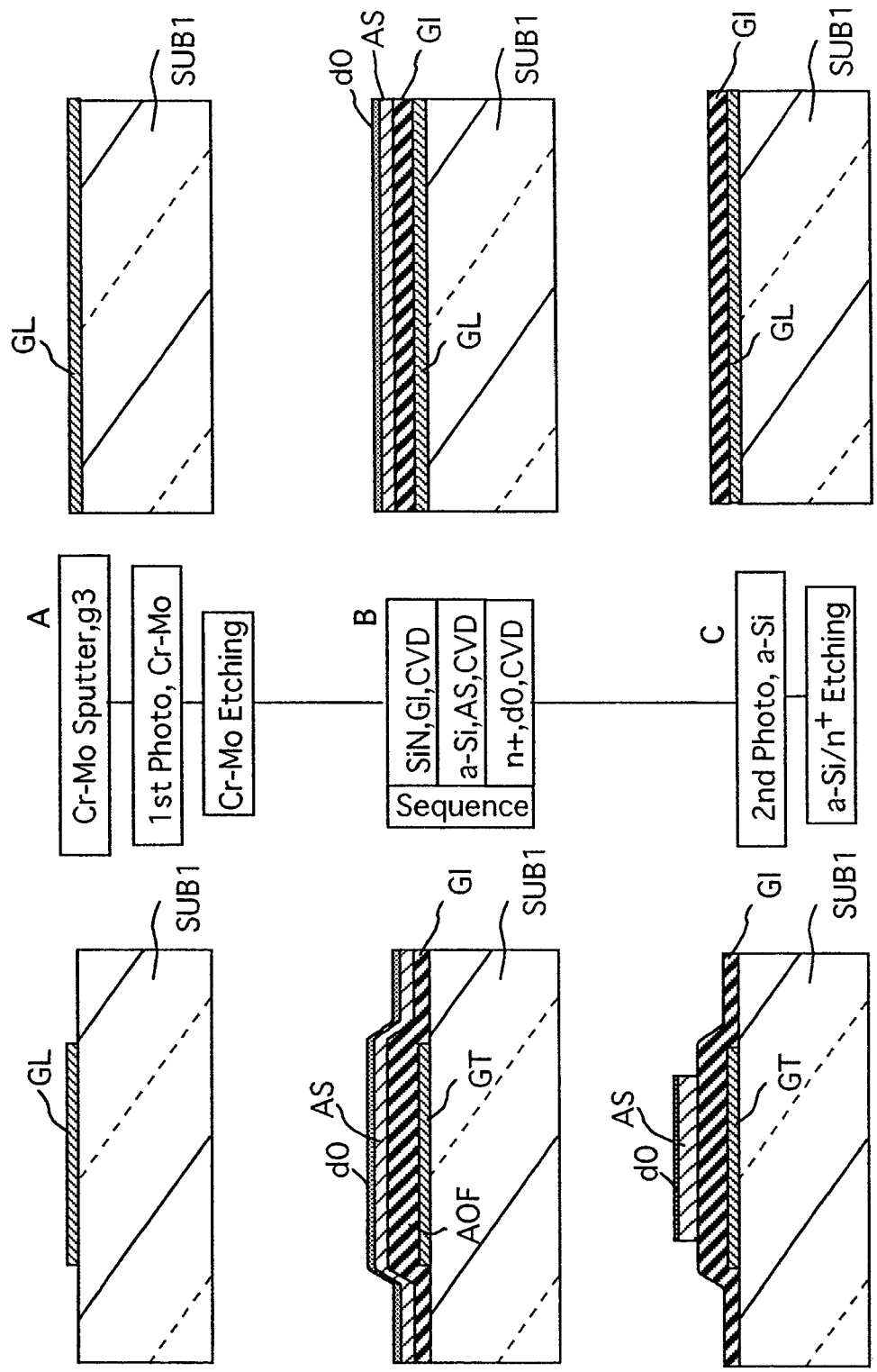
FIG. 13 is a flow chart of a pixel portion and a gate terminal portion in cross section showing manufacturing steps A-C in the manufacture of the substrate SUB1 side.

Step A, FIG. 13

A conductive film g3 made of Cr—Mo or the like which has a film thickness of 2000 Å is formed on the lower transparent glass substrate SUB1 made of AN635 glass (name of product) by spattering. After the photographic treatment, the conductive film g3 is selectively etched using second cerium ammonium nitrate, thus forming the gate electrodes GT, the gate lines GL, the counter lines CL, the gate terminals GTM, a first conductive layer of the common bus line CB1, first conductive layers of the counter electrode terminals CTM1 and the bus line SHg (not shown in drawings) which is connected with gate terminals GTM.

Step B, FIG. 13

Ammonia gas, silane gas, and nitrogen gas are introduced into the plasma CVD apparatus so as to form a silicon nitride film having a thickness of 3500 Å, while silane gas and hydrogen gas are introduced into the plasma CVD apparatus so as to form the i-type amorphous Si film having a thickness of 1200 Å; and, thereafter, hydrogen gas and phosphine gas are introduced into the plasma CVD apparatus so as to form the N(+) type amorphous Si film having a thickness of 300 Å.

Step C, FIG. 13

After photographic treatment, the N(+) type amorphous Si film or the i-type amorphous Si film is selectively etched by using SF6 or CC14 as a dry etching gas so as to form the island of the i-type semiconductor layer AS.

Figure 14:
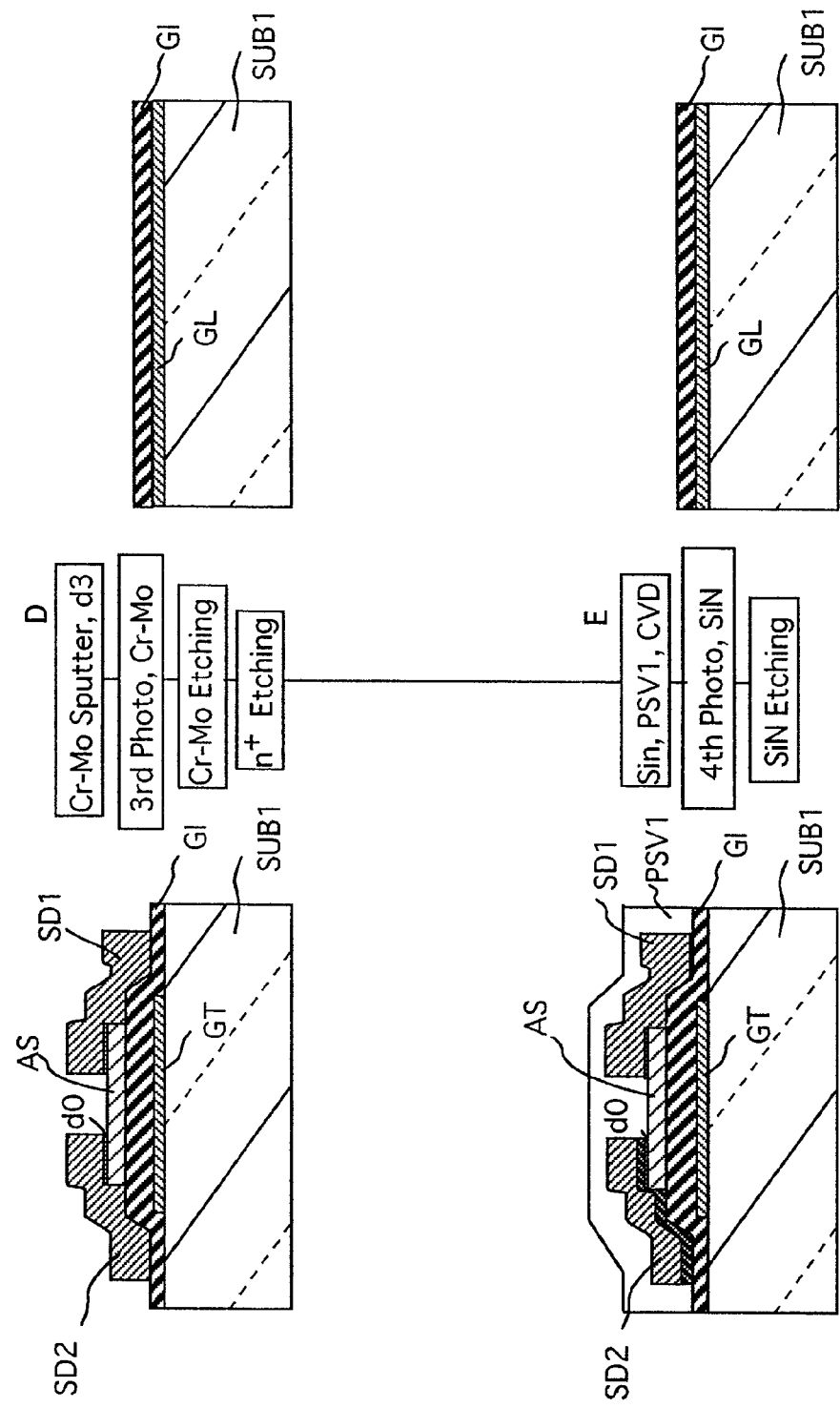
FIG. 14 is a flow chart of a pixel portion and a gate terminal portion in cross section showing manufacturing steps D-E in the manufacture of the substrate SUB1 side.

Step D, FIG. 14

A conductive film d3 made of Cr and having a thickness of 300 Å is formed by spattering. After the photographic treatment, the conductive film d3 is etched using a liquid similar to that of the step A so as to form the drain line DL, the source electrode SD1, the drain electrode SD2, a first conductive layer of the common bus line CB2 and the bus line SHd (not shown in the drawings) which causes the drain terminals DTM to be short-circuited. Subsequently, CC14, SF6 are introduced to a dry etching device so as to etch the N(+) type amorphous Si film, thus selectively removing an N(+) type semiconductor layer d0 disposed between the source and the drain. After the conductive film d3 is patterned by the mask pattern, the N(+) type semiconductor layer d0 is excepted by the mask of conductive film d3. That is, the N(+) type semiconductor layer d0 remaining on the i-type semiconductor layer AS is removed by a self aligning process, except for the conductive layer d1 and the conductive layer d2. In such a case, the N(+) type semiconductor layer d0 is totally removed to its full thickness by etching so that the i-type semiconductor layer AS is slightly removed by etching. However, the degree of such an etching can be controlled by control of the etching time.

Step E, FIG. 14

Ammonia gas, silane gas, and nitrogen gas are introduced into the plasma CVD apparatus so as to form a silicon nitride Si film having a thickness of 0.3 μm. After photographic treatment, by selectively etching the silicon nitride Si film using SF6 as a dry etching gas, a patterning of the passivation layer PSV1 is performed.

Figure 15:
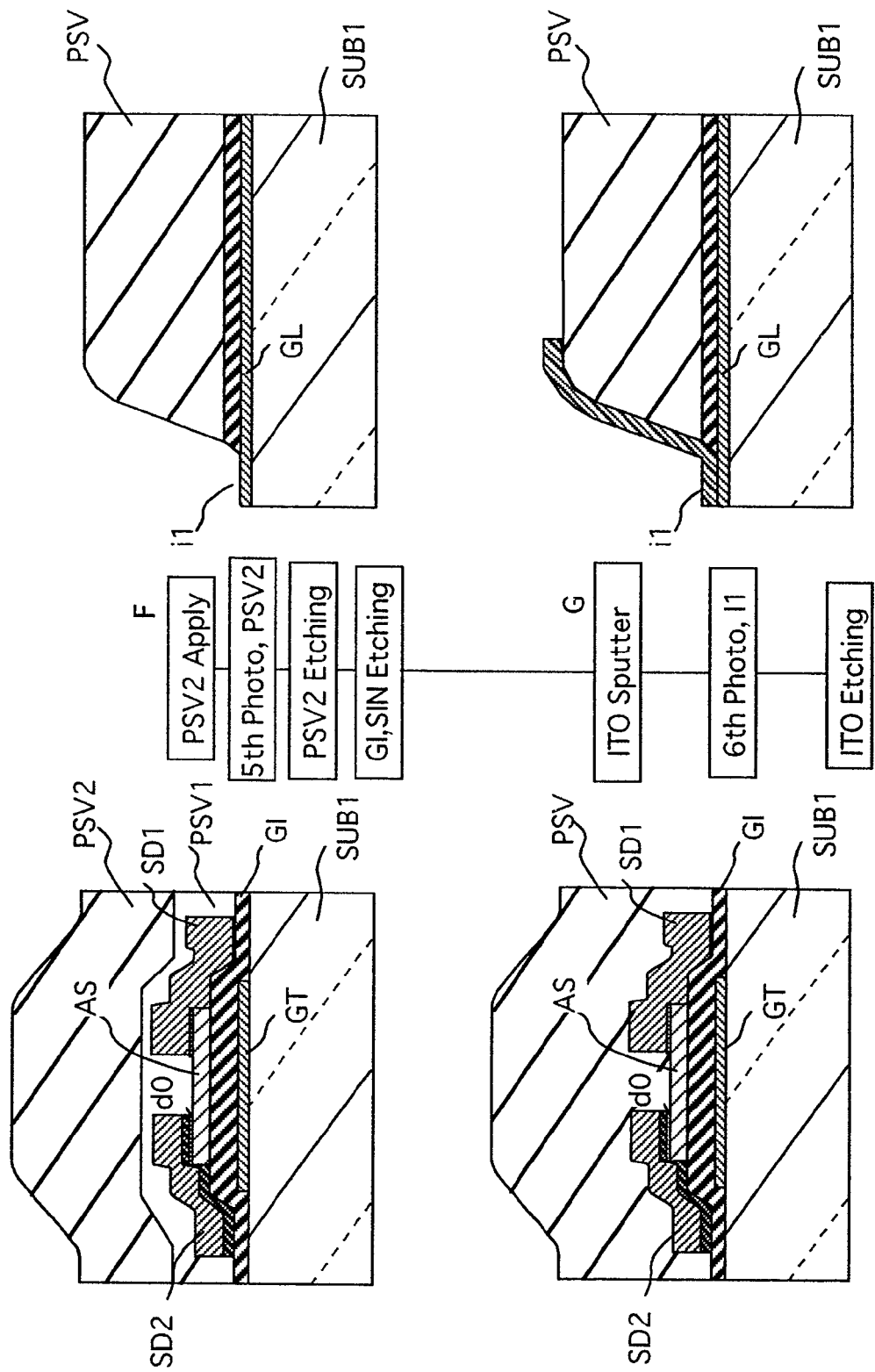
FIG. 15 is a flow chart of a pixel portion and a gate terminal portion in cross section showing manufacturing steps F-G in the manufacture of the substrate SUB1 side.

Step F, FIG. 15

After coating a photosensitive organic passivation layer PSV2, the layer is exposed using a photomask, and a patterning is performed. Using this as a mask, the insulating film GI is subjected to dry etching in the same manner as that of the step E. Accordingly, the organic passivation layer PSV2 and the insulating film GI are collectively subjected to working including the patterning while using the same photomask.

Step G, FIG. 15

A transparent conductive film i1 which is made of an ITO film and has a film thickness of 1400 Å is formed by spattering. After photographic treatment, the transparent conductive film i1 is selectively etched using a mixed acid liquid made of hydrochloric acid and nitric acid as an etchant so as to form an uppermost layer of the gate terminals GTM, the drain terminals DTM and counter electrode terminals CTM1 and a second conductive layer of CTM2.

<<Display Panel PNL and Drive Circuit Board PCBI>>

Figure 16:
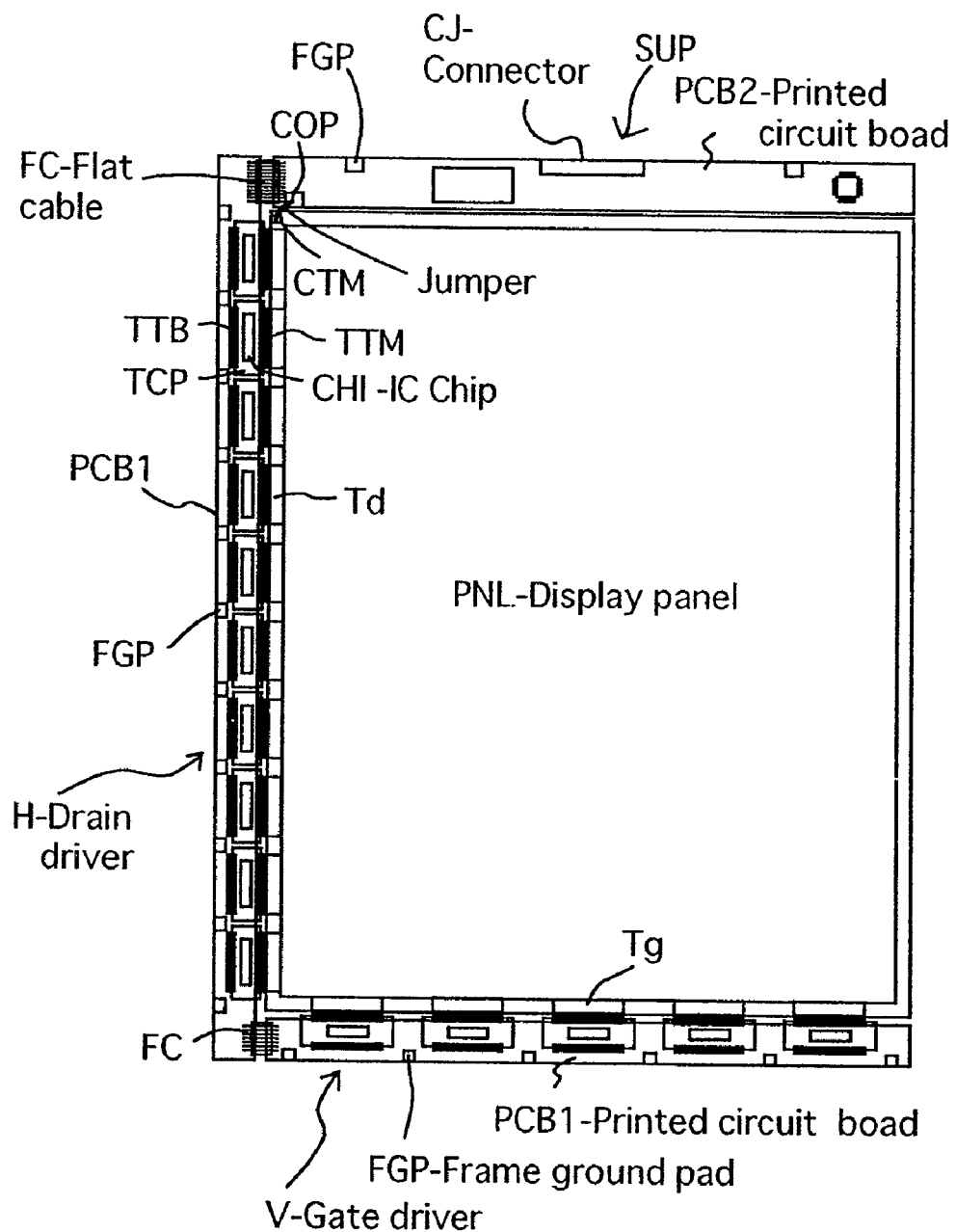
FIG. 16 is a top plan view showing a condition in which peripheral drive circuits are mounted on a liquid crystal display panel.

FIG. 16 is a top plan view showing a condition where the drain driver H and the gate driver V are connected to the display panel PNL shown in FIG. 5 and the like.

CHI indicates drive IC chips for driving the display panel PNL (lower-side 5 pieces are drive IC chips of the gate driver side and left-side 10 pieces are drive IC chips of the drain driver side). TCP is a tape carrier package on which drive IC chips CHI are mounted, as will be explained later in view of FIG. 13 and FIG. 14, by a tape automated bonding method (TAB), while PCB1 is a drive circuit board on which the above-mentioned TCP and capacitors and the like are mounted, and the board is divided in two for the drain driver and for the gate driver. FGP indicates a frame grand pad and is produced by soldering spring shaped pieces which are formed by cutting in a shield case SHD. FC indicates a flat cable for electrically connecting the lower-side drive circuit board PCB1 with the left-side drive circuit board PCB1. As such a flat cable FC, as shown in the drawings, a cable which sandwiches and supports a plurality of lead wires (Sn plated to phosphor bronze as raw material) by means of polyethylene layer and polyvinylalcohol layer in stripes is used.

<<Connection structure of TCP>>

Figure 17:
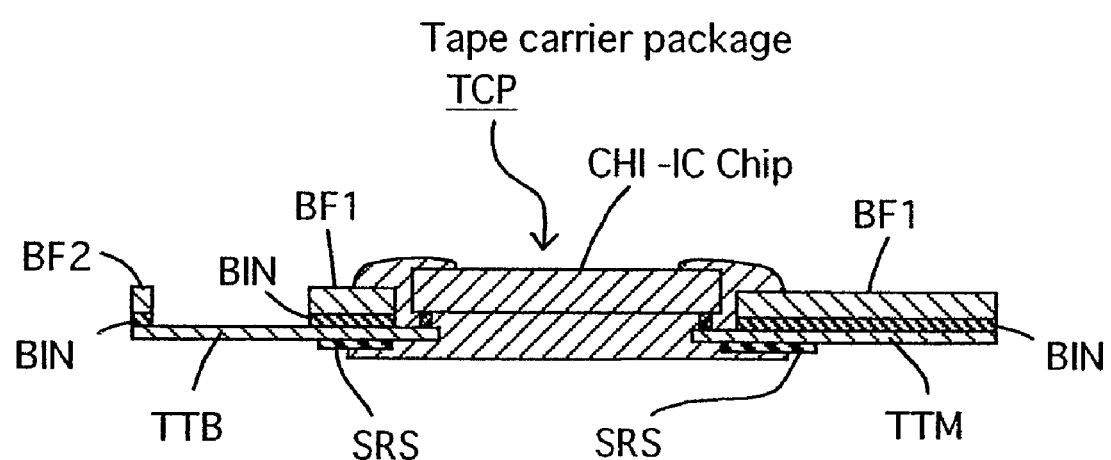
FIG. 17 is a sectional view showing the cross sectional structure of a tape carrier package TCP in which integral circuit chips CH1 which constitute a drive circuit are mounted on a flexible wiring substrate.
Figure 18:
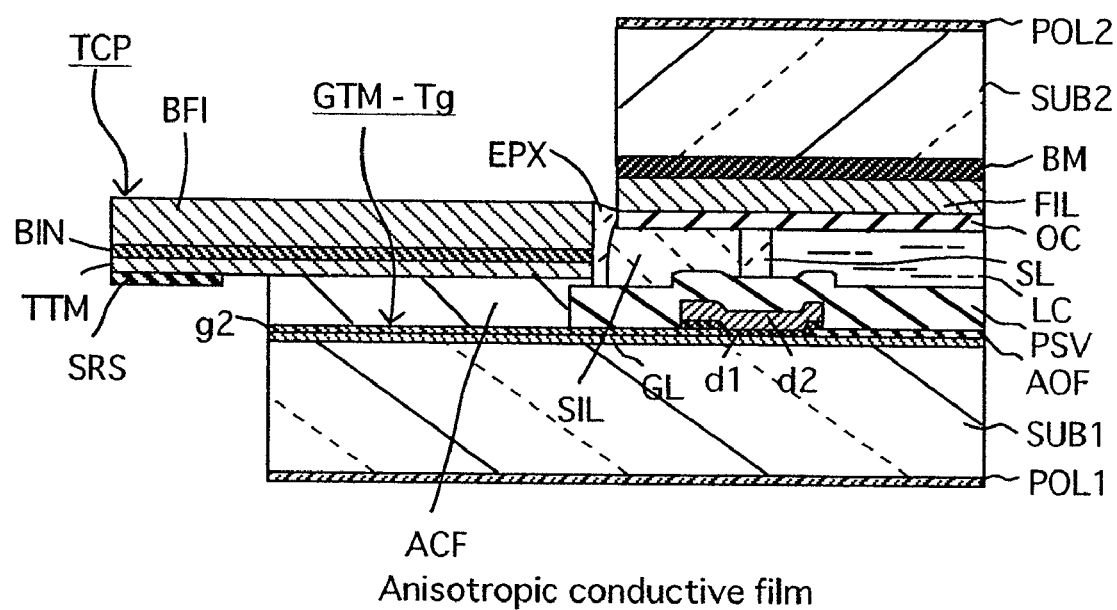
FIG. 18 is a cross sectional view of essential parts of in a condition in which the tape carrier package TCP is connected to a scanning signal circuit terminal GTM of a liquid crystal display panel PNL.

FIG. 17 shows the cross-sectional structure of the tape carrier package TCP which constitutes the gate driver V and the drain driver H and in which integrated circuit chips CHI are mounted on a flexible wiring board. FIG. 18 is a cross-sectional view of an essential portion where the tape carrier package TCP is connected to the scanning signal circuit terminals GTM of the liquid crystal display panel in this example.

In these drawings, TTB indicates an input terminal and wiring portion of the integrated circuit CHI, while TTM indicates an output terminal and wiring portion. They are made of Cu, for example, and bonding pads PAD of the integrated circuits CHI are respectively connected to the inner distal ends (usually called inner leads) thereof by a face-down bonding method. Outside distal end portions (usually called outer leads) of the terminals TTB, TTM respectively correspond to the inputs and the outputs of the semiconductor integrated circuit chips CHI and are connected to a CRT/TFT converting circuit/power source circuit SUP by solder bonding or the like and are connected to the liquid crystal display panel PNL by means of an anisotropic conductive film ACF. A package TCP is connected to the panel such that the distal end thereof covers the passivation layer PSV1 which has the panel PNL-side connecting terminals GTM exposed. Accordingly, the external connecting terminals GTM (DTM) are covered by at least either one of the passivation layer PSV1 or the package TCP, and, hence, they have a sufficient resistance against electrolytic corrosion.

BF1 is a base film made of polyimide or the like and SRS is a solder resist film for masking to prevent the solder from adhering to unnecessary portions during soldering. The gap defined between the upper and lower glass substrates at the outside of the seal pattern SL is protected by epoxy resin EPX or the like after being cleaned; and, furthermore, a silicone resin SIL is charged between the package TCP and the upper substrate SUB2 so as to provide a multiplied protection.

<<Drive Circuit Board PCB2>>

On the drive circuit board PCB2, electronic components such as ICs, capacitors and resistors and the like are mounted. On this drive circuit board PCB2, a power source circuit for obtaining a plurality of partial-pressure stabilized voltage sources, and the circuit SUP including a circuit for converting information for a CRT (cathode ray tube) supplied from a host (superior arithmetic unit) into information for the TFT liquid crystal display device are mounted. CJ is a connecting portion to which a connector, which is not shown in the drawing, is connected for connection with the outside.

The drive circuit board PCB1 and the drive circuit board PCB2 are electrically connected with each other by means of the flat cable FC.

<<Entire Construction of Liquid Crystal Display Module>>

Figure 19:
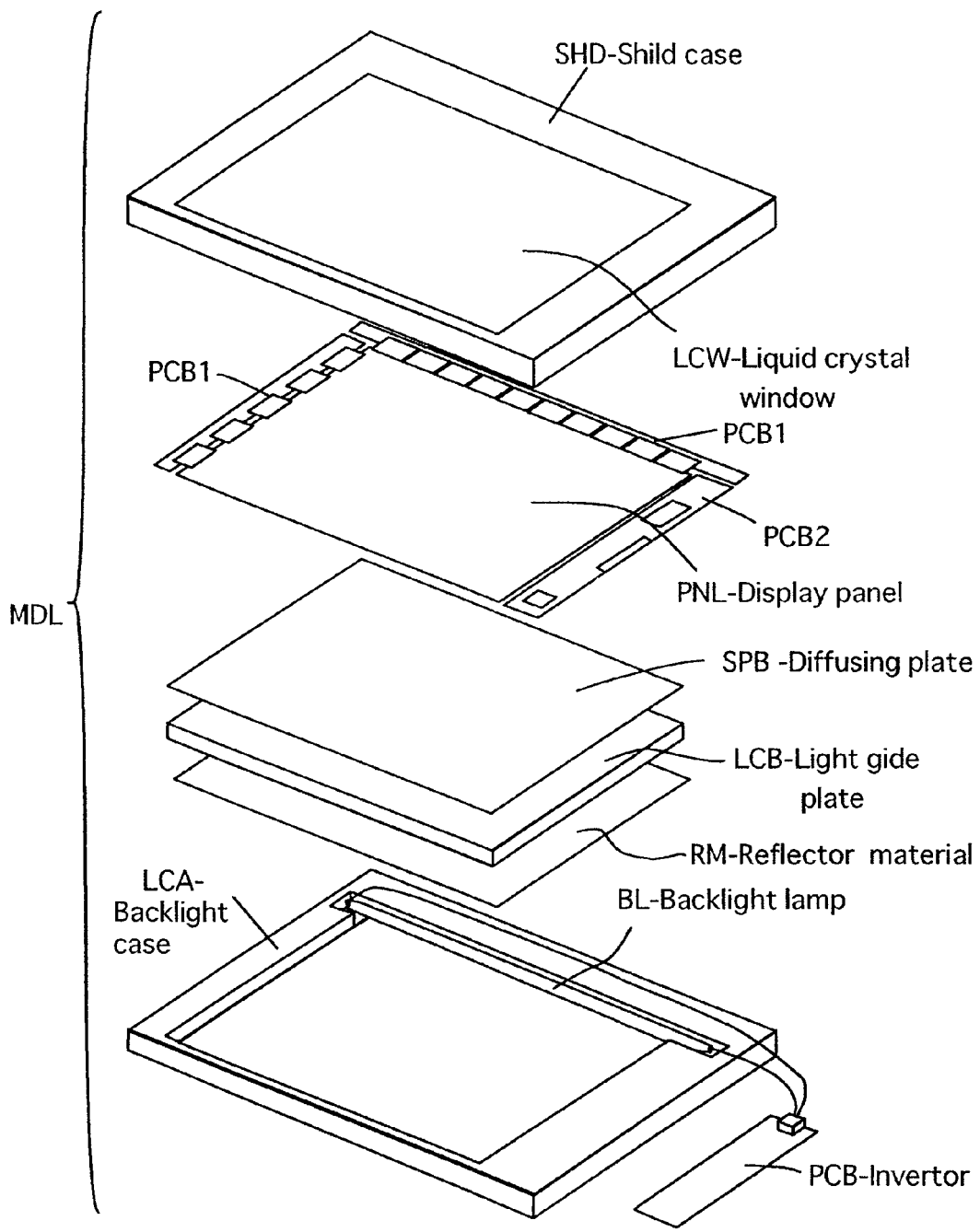
FIG. 19 is an exploded perspective view of a liquid crystal display module.

FIG. 19 is an exploded perspective view of respective components of the liquid crystal display module MDL.

SHD indicates a frame-like shield case (metal frame) made of a metal plate, LCW indicates a display window, PNL indicates a liquid crystal display panel, SPB indicates a light diffusion plate, LCB indicates a light guide body, RM indicates a reflecting plate, BL indicates a back light fluorescent tube and LCA is a back light case. Respective members are stacked while maintaining the vertical arrangement relationship shown in the drawing to assemble the module MDL.

The module MDL has its entire body fixedly secured by means of pawls and hooks mounted on the shield case SHD.

The back light case LCA has a shape suitable for accommodating the back light lamp BL, the light diffusion plate SPB, the light guide body LCB and the reflection plate RM. Light produced by the back light lamp BL, which is disposed on the side surface of the light guide body LCB, is turned into a back light which is uniform on the display surface by means of the light guide body LCB, the reflection plate RM and the light diffusion plate SPB, and this light is emitted toward the liquid crystal display panel PNL side.

An inverter circuit board PC3 is connected to the back light lamp BL and this constitutes the power source of the back light lamp BL. The effect of the liquid crystal display element constructed in the above manner is generated by following three operations.

<Operation 1>

Against the drain line formed on one transparent substrate side, the reference electrode is formed on the organic insulating film in a completely overlapped condition as seen in a plan view, and, hence, almost all unnecessary lines of electric force generated from the drain line are terminated at the reference electrode. Accordingly, crosstalk caused by a leakage electric field peculiar to the display system, such as the system of the present invention which adopts the transverse electric field can be eliminated. Therefore, a leakage electric field scheme, can be more completely shielded than can be accomplished by the shield electrodes which have been conventionally disposed at both sides of the drain line or on the counter substrate for reducing crosstalk, and, hence, the horizontal direction of the pixels can be occupied by the display electrode, the reference electrode and the opening. Furthermore, it is unnecessary to hide the gap between the drain line and the reference electrode, and, hence, the vertical light blocking film (black matrix) can be eliminated. Due to such a construction, the typical low aperture efficiency, which is the major defect of the display system which employs a transverse electric field, can be drastically improved, thus realizing an aperture efficiency exceeding 50%. That is, according to the present invention, a high aperture efficiency and the a smear condition are compatible.

<Operation 2>

Compared to the inorganic insulating film, the specific dielectric constant of the organic insulating film is approximately half (the specific dielectric constant $\in r$ being about 3) of the inorganic insulating film. Furthermore, since it is possible to easily increase the thickness of the organic passivation layer compared to an inorganic passivation layer, the distance between the drain line and the reference electrode can be widened. Even when the drain line is completely overlapped by the reference electrode, the capacitance generated between the drain line and the reference electrode can be made considerably small. Accordingly, the load as seen from the drain line becomes small so that the wiring propagation delay of the image signal becomes small, the signal voltage is sufficiently charged to the display electrode, and the drive circuit for driving the drain line can be minimized.

<Operation 3>

The organic passivation layer has an excellent flatness so that by coating the organic passivation layer onto, the top layer of the substrate which constitutes an active element, the flatness of the substrate which constitutes the active element is enhanced. Accordingly, irregularities in the brightness (transmissivity)—voltage characteristics which are caused by the irregularities in the gap between the substrates can be eliminated, and, hence, the uniformity of the brightness can be enhanced.

As can be clearly understood from the foregoing explanation, according to the liquid crystal display device of this embodiment, the so-called longitudinal smear, which is a fundamental problem in a liquid crystal display device for an extremely broad angle of visual field which adopts the transverse electric field system, can be restricted. Accordingly, the advantages of reduction of the power consumption and the size reduction of the peripheral circuit are simultaneously achieved. Furthermore, the uniformity of the brightness can be enhanced.

Embodiment 2

Figure 20:
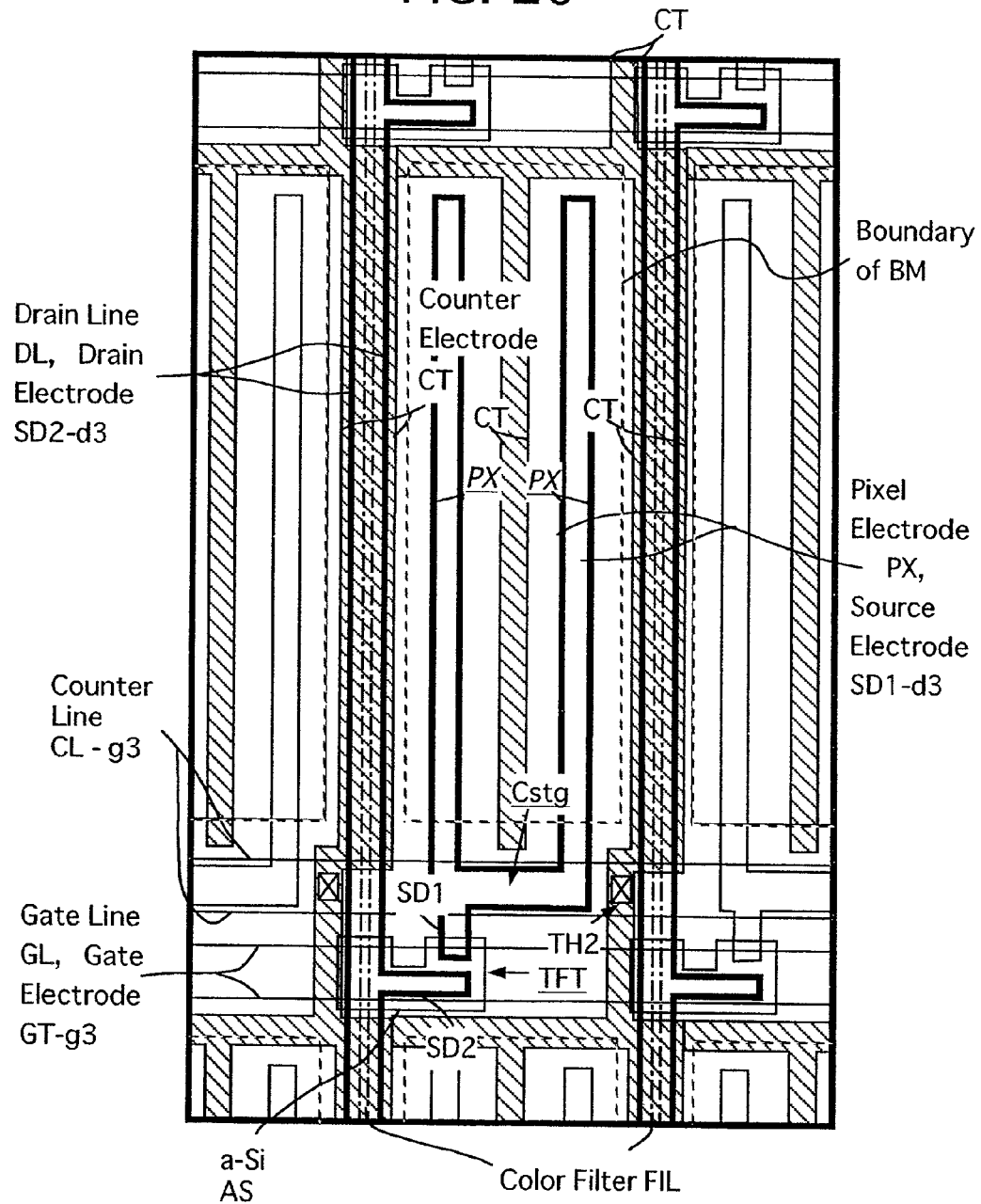
FIG. 20 is a plan view of essential parts showing one pixel and its periphery of a liquid crystal display portion of an active matrix system color liquid crystal display device representing another embodiment of the present invention.
Figure 21:
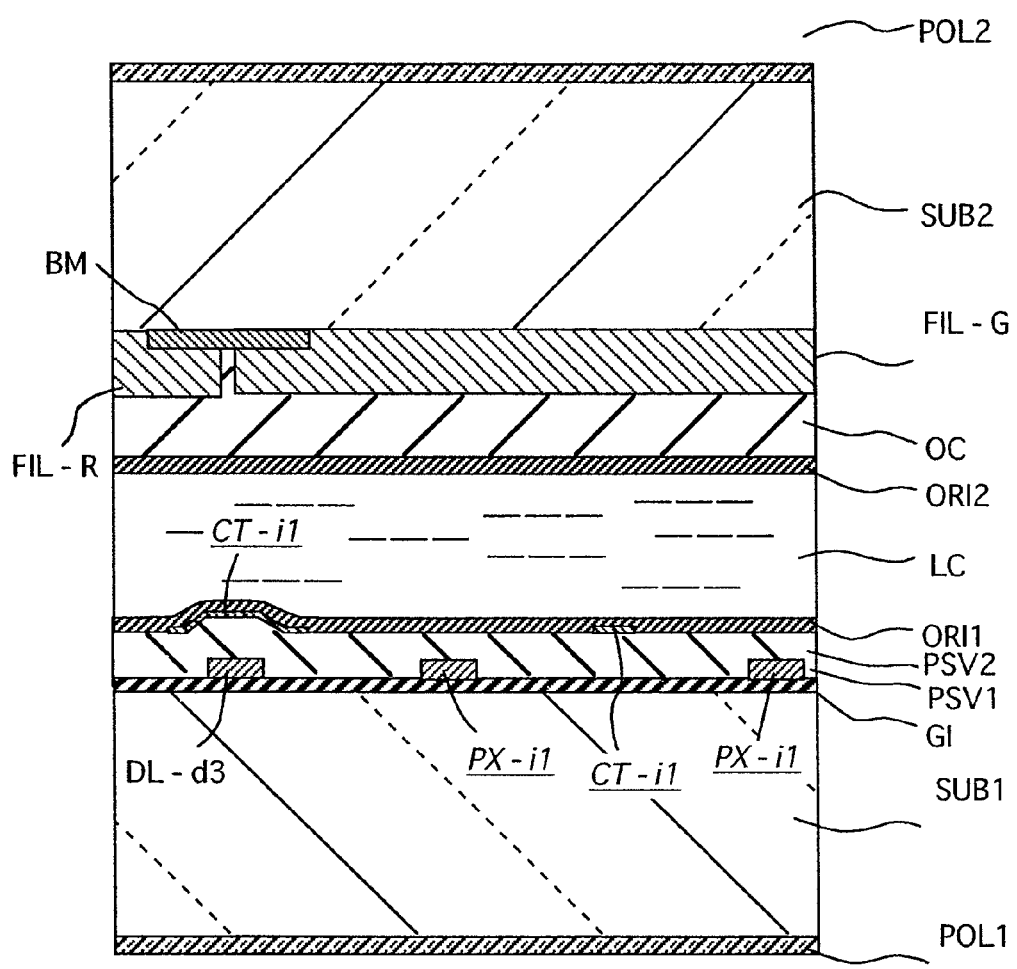
FIG. 21 is a cross sectional view of a comb electrode portion of the active matrix system color liquid crystal display device of FIG. 20.

The present embodiment is the same as the embodiment 1 except for the following conditions. FIG. 20 is a plan view of the pixel and FIG. 21, is a cross-sectional view of a comb-shaped electrode portion.

<<Pixel Electrode PX>>

In this embodiment, the pixel electrode PX is comprised of a source electrode SD1, a drain electrode SD2 and a conductive film d3 on the same layer as the drain electrode SD2. Furthermore, the pixel electrode PX is integrally formed with the source electrode SD1.

According to this embodiment, in addition to the effects of the first embodiment, a contact failure with the pixel electrode PX can be avoided, although the transmissivity is sacrificed. Furthermore, since the pixel electrode PX is covered with an insulating film (the passivation layer PSV1), when an orientation failure occurs, the possibility that a direct current will flow through the liquid crystal is lowered, thus eliminating a deterioration and the like of the liquid crystal, so that the reliability is further enhanced compared to the embodiment 1.

Embodiment 3

Figure 22:
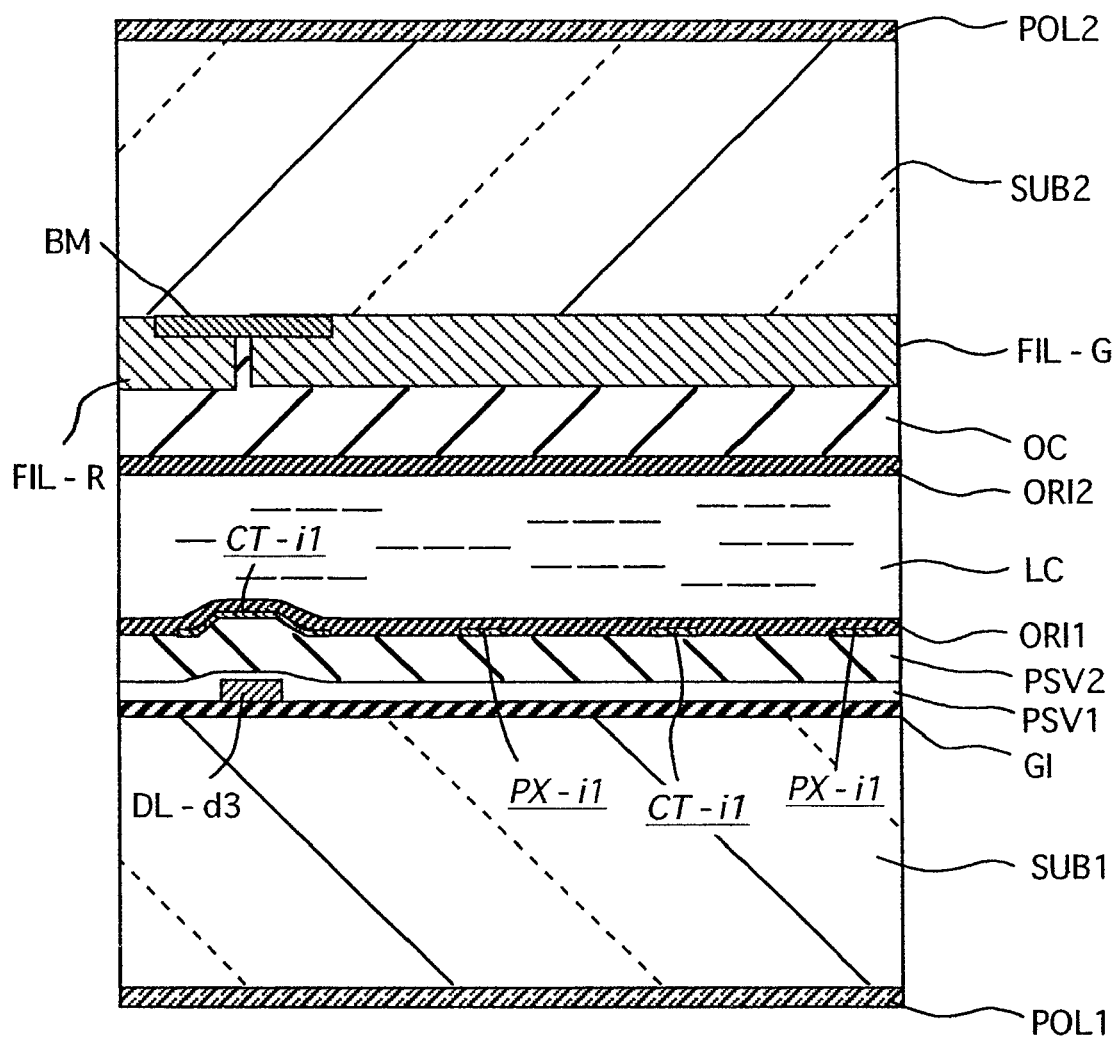
FIG. 22 is a cross sectional view of a comb electrode portion of the active matrix system color liquid crystal display device representing a further embodiment of the present invention.

The present embodiment is the same as the embodiment 1 except for the following conditions. FIG. 22 is a cross-sectional view of the pixel of this embodiment.

<<Passivation Layer PSV1, Organic Passivation Layer PSV2>>

In this embodiment, the passivation layer PSV1 and the organic passivation layer PSV2 are collectively removed, such that the external connecting terminals DTM, GTM are exposed. Accordingly, in contrast to the embodiment 1, the passivation layer PSV1 is formed on most of the pixel. Furthermore, in the pixel portion, for assuring an electric connection between the counter line CL and the counter electrode CT, which will be explained later, and an electric connection between the source electrode SD2 and the pixel electrode PX, through holes TH2 and TH1 are formed. At the through hole TH2, the organic passivation layer PSV2, the passivation layer PSV1 and the insulating film GI are collectively subjected to working and a hole which reaches the layer g3 is formed, while at the through hole TH1, the organic passivation layer PSV2 and the passivation layer PSV1 are collectively subjected to working and a hole is blocked by the layer d3, thus forming a hole which reaches the layer d3.

In this embodiment, resist material is used for the organic passivation layer PSV2. First of all, the resist material is developed by photolithography, the resist material at the through hole portion is removed, and the pattern of the resist material is formed. As a mask for this pattern made of this resist material, the passivation layer PSV1 and the insulating film GI are collectively etched to form the pattern of the passivation layer PSV1 and the insulating film GI. This step is the same as the step for forming the TFT of the embodiment 1. Here, although this resist material is usually removed, in this embodiment, the resist material is retained and is used as the organic passivation layer PSV2.

Furthermore, in this embodiment, by setting the thickness of the passivation layer PSV1 to 0.1 μm which is an extremely thin value, the etching time of the passivation layer PSV1 is prevented from being prolonged, and, hence, the throughput is enhanced. The passivation layer PSV1 is provided for protecting the back channel portion of the thin film transistor element TFT, that is, for stabilizing the threshold voltage Vth of the thin film transistor, and it is sufficient if a thickness of 0.05 to 0.3 μm is assured.

In this manner, although in the embodiment 1, the passivation layer PSV1, the organic passivation layer PSV2 and the insulating film GI are respectively and independently produced through an individual photolithography step using individual photo masks, in this embodiment, they can be performed collectively using a single mask; and, hence, the throughput for producing the TFT substrate is greatly enhanced compared to the first embodiment, and, as a result, the mass productivity is greatly enhanced.

Furthermore, the collective working of the organic passivation layer PSV2 and the insulating film GI and the collective working of the organic passivation layer PSV2 and the passivation layer PSV1 can be performed in the same manner as this embodiment and they belong to the category or scope of the present invention.

Accordingly, in this embodiment, in addition to the effects of the embodiment 1, the mass productivity is greatly enhanced.

Embodiment 4

This embodiment is similar to the embodiment 1 except for the following.

<<Planar Construction of Matrix Portion (Pixel Portion)>>

Figure 23:
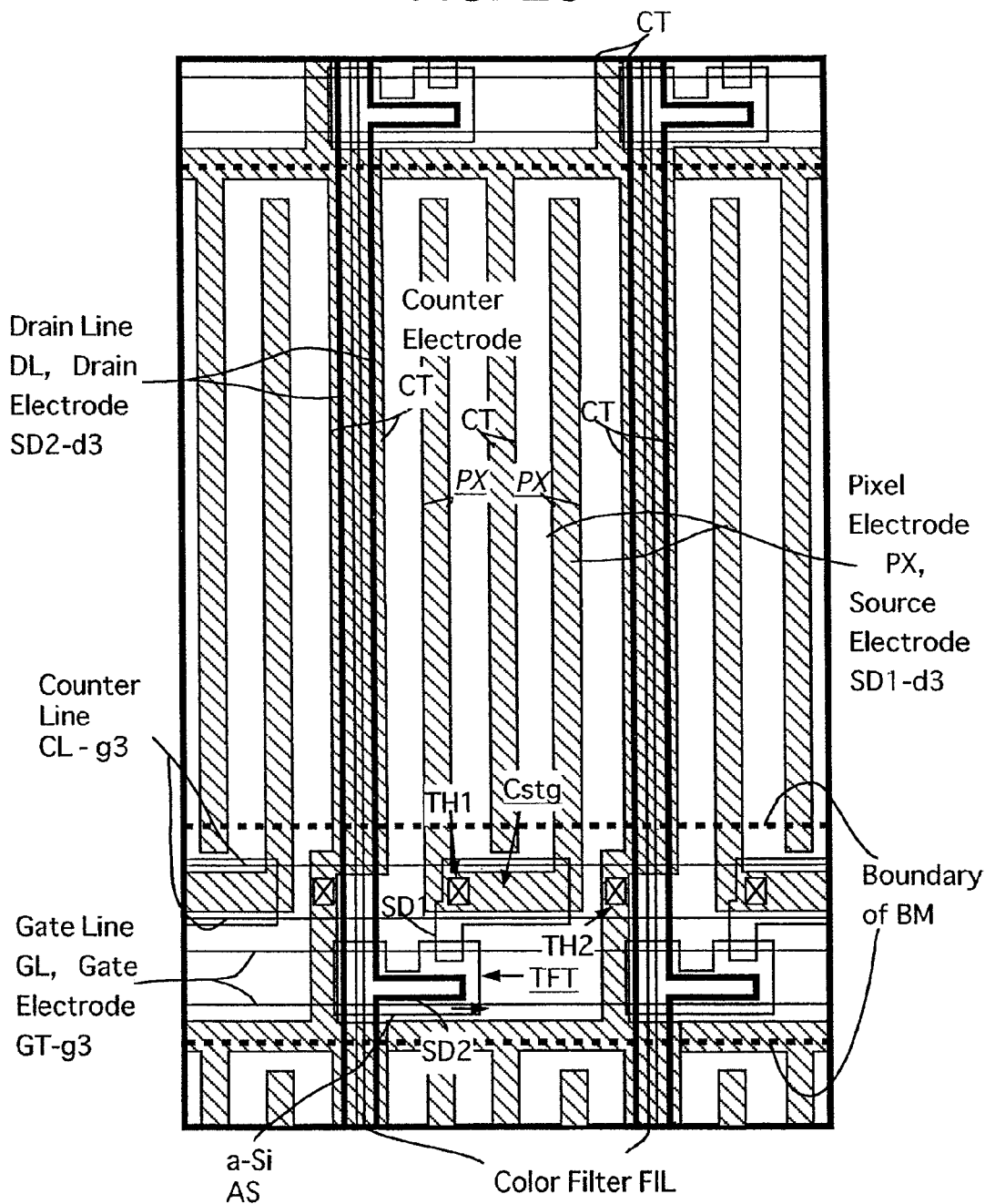
FIG. 23 is a plan view of an essential part showing one pixel and its periphery of a liquid crystal display part of an active matrix system color liquid crystal display device of still another embodiment of the present invention.

FIG. 23 is a plan view showing one pixel and its periphery of the active matrix system color liquid crystal display device of this embodiment.

<<Light Blocking Film BM>>

In this embodiment, the light blocking films BM in stripes are formed only in a horizontal direction of the pixel pattern. With such a provision, a lowering of the aperture efficiency due to misalignment of the color filter substrate and the TFT substrate can be resolved. In case the pattern of the light blocking films in a vertical direction of the pixel pattern is shifted in a horizontal direction, the aperture efficiency is drastically lowered. In this embodiment, since the pattern of the light blocking films in a vertical direction is eliminated, even when such a misalignment occurs, there is substantially no change in the aperture efficiency. It is construed that by making the counter electrode CT completely cover the drain line DL, when viewed from the liquid crystal layer, nothing is present except for the repetitious pattern of the pixel electrodes and the counter electrodes, and, hence, this becomes possible.

Accordingly, in this embodiment, it is sufficient to perform only a shielding of light on the TFT and a shielding of light at the light leakage portion between the counter electrode and the gate line. In this manner, with the light blocking film BM provided in stripes only in a horizontal direction, this embodiment can greatly enhance the aperture efficiency, and, hence, this embodiment can enhance the brightness in addition to the effects of the embodiment 1.

Embodiment 5

Figure 24:
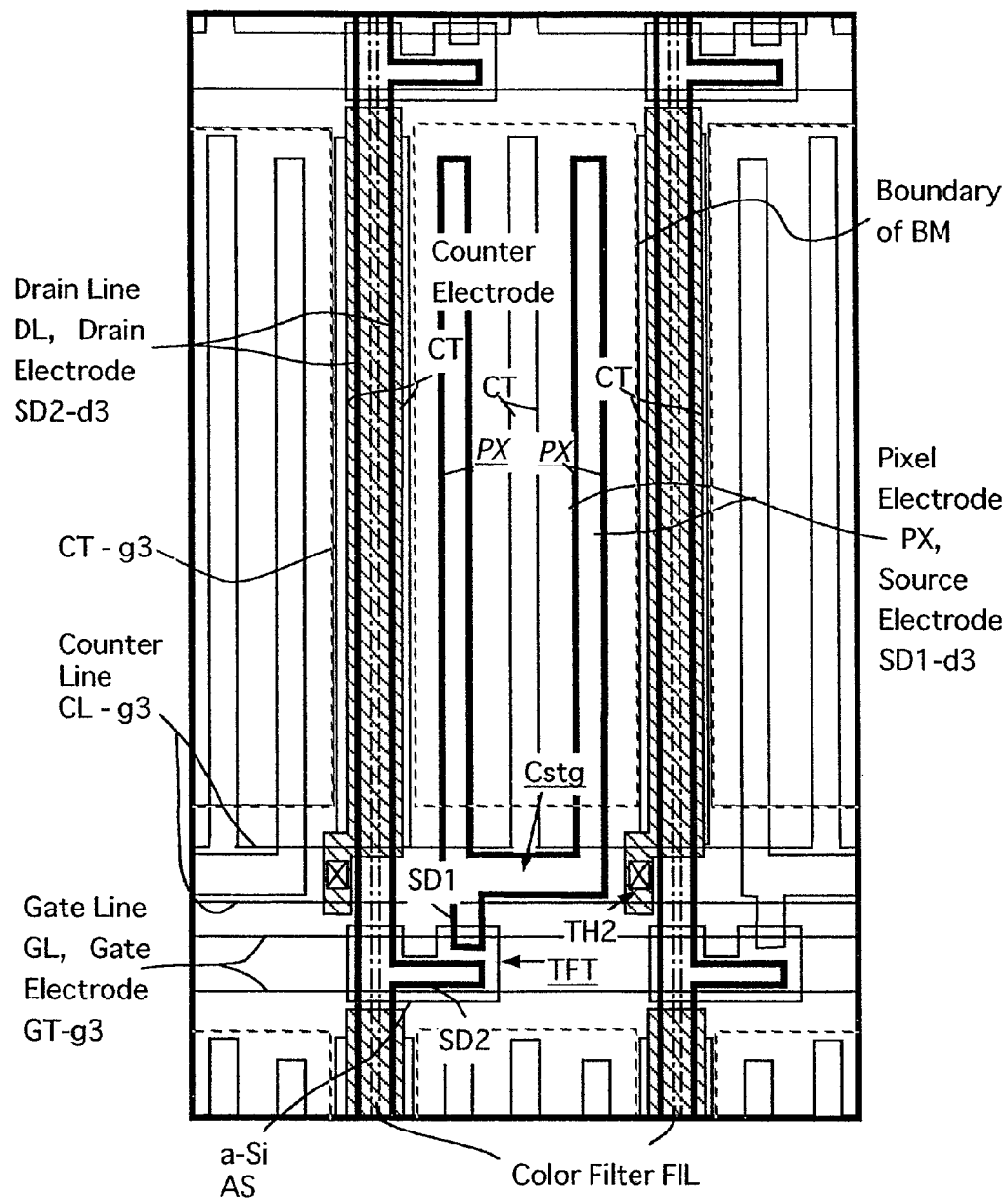
FIG. 24 is a plan view of an essential part showing one pixel and its periphery of a liquid crystal display part of an active matrix system color liquid crystal display device of a still further embodiment of the present invention.
Figure 25:
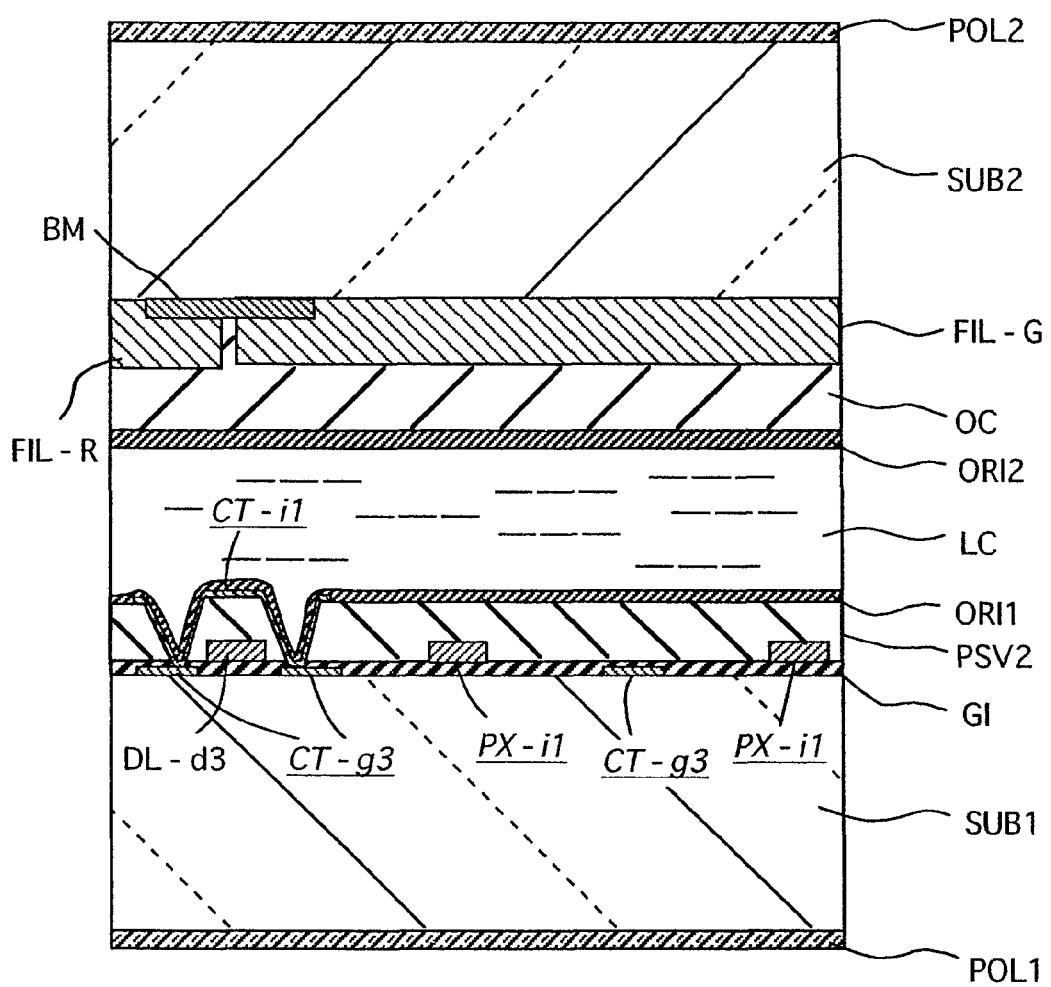
FIG. 25 is a cross sectional view of a comb electrode portion of the active matrix system color liquid crystal display device of FIG. 24.

The present embodiment is the same as the embodiment 2 except for the following conditions. FIG. 24 is a plan view of the pixel and FIG. 25 is a cross-sectional view of the comb electrode portion.

<<Counter Electrode CT>>

In this embodiment, the counter electrode CT includes a portion which protrudes from the gate line GL, the gate electrode GT and the counter line CL which is constructed by the conductive film g3 on the same layer as the counter line CL and a portion which is formed of the conductive film i1 on the passivation layer PSV2 as in the case of the embodiment 2. Furthermore, through holes are formed in the portion protruding from the counter line CL, which is made of the conductive film g3 and the portion formed of the conductive film i1 on the passivation layer PSV2 and they are electrically connected with each other and are constructed such that they embrace the drain line.

Due to such a construction, this embodiment can reduce the leakage electric field peculiar to the transverse electric field system more effectively than the embodiment 1 and the embodiment 2 so that crosstalk can be resolved.

As can be understood from the foregoing explanation, according to the liquid crystal display device of the present invention, a so-called longitudinal smear, which is an intrinsic problem in the liquid crystal display device having a super broad visual field angle and which adopts the transverse electric field system, can be restricted, thus enabling an enhancement of the brightness, a reduction of the power consumption, a downsizing of the peripheral circuit and an enhancement of the uniformity of the brightness.

What is claimed is:

1. A liquid crystal display device comprising:
    first and second substrates with a liquid crystal layer therebetween; and
    a plurality of gate signal lines and a plurality of drain signal lines formed on the first substrate,
    wherein a plurality of pixel regions are defined by the gate signal lines and the drain signal lines;
    wherein a pixel electrode and a counter electrode are formed in each of the pixel regions,
    wherein the pixel electrode and the counter electrode are formed in different layers, and
    wherein the counter electrode is formed in a layer that is nearer to the liquid crystal layer than the pixel electrode,
    wherein the counter electrode has a plurality of branches parallel to the drain signal line, and
    at least one of the branches of the counter electrode is positioned at the position which overlaps at least one of the drain signal line.

2. A liquid crystal display device according to claim 1, wherein the pixel electrodes and the drain signal lines are formed in the same layer.

3. A liquid crystal display device according to claim 1, wherein a black matrix is formed over the gate signal lines and the drain signal lines.

4. A liquid crystal display device according to claim 3, wherein:
    a counter voltage signal line is formed in parallel with the gate signal lines;
    the counter voltage signal line is formed in a different layer from the counter electrode; and
    the counter voltage signal line is connected with the counter electrode by a through hole.

5. A liquid crystal display device according to claim 4, wherein the through hole is formed in a position which overlaps with the black matrix.

6. A liquid crystal display device according to claim 3, wherein the pixel electrode has a plurality of branches parallel to the drain signal lines, and
    the branches of the pixel electrode and the branches of the counter electrode are arranged in positions which are not mutually overlapped.

7. A liquid crystal display device according to claim 6, wherein the pixel electrode is arranged at the opening portion of the black matrix.

8. A liquid crystal display device according to claim 1, wherein the width of the at least one branch of the counter electrode which is overlapped with the at least one of the drain signal lines is wider than the width of the at least one drain signal line.

9. A liquid crystal display device according to claim 1, wherein the width of the at least one branch of the counter electrode which is overlapped with the at least one drain signal line is wider than the width of at least one of the other branches of the counter electrode.

* * * * *